(12) United States Patent
Smith et al.

(10) Patent No.: US 9,793,372 B1
(45) Date of Patent: Oct. 17, 2017

(54) INTEGRATED CIRCUIT INCLUDING A DUMMY GATE STRUCTURE AND METHOD FOR THE FORMATION THEREOF

(71) Applicant: GLOBALFOUNDRIES Inc., Grand Cayman (KY)

(72) Inventors: Elliot John Smith, Dresden (DE); Jan Hoentschel, Dresden (DE); Nigel Chan, Dresden (DE); Sven Beyer, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/163,806

(22) Filed: May 25, 2016

(51) Int. Cl.
| | |
|---|---|
| H01L 29/49 | (2006.01) |
| H01L 29/66 | (2006.01) |
| H01L 27/12 | (2006.01) |
| H01L 29/78 | (2006.01) |
| H01L 21/308 | (2006.01) |
| H01L 21/306 | (2006.01) |
| H01L 29/423 | (2006.01) |
| H01L 29/06 | (2006.01) |
| H01L 29/417 | (2006.01) |
| H01L 21/84 | (2006.01) |

(52) U.S. Cl.
CPC .... *H01L 29/66545* (2013.01); *H01L 21/3085* (2013.01); *H01L 21/30604* (2013.01); *H01L 21/84* (2013.01); *H01L 27/1203* (2013.01); *H01L 29/0649* (2013.01); *H01L 29/41783* (2013.01); *H01L 29/42324* (2013.01); *H01L 29/4916* (2013.01); *H01L 29/66484* (2013.01); *H01L 29/7831* (2013.01)

(58) Field of Classification Search
CPC .......... H01L 29/66545; H01L 29/0649; H01L 29/41783
See application file for complete search history.

(56) References Cited

U.S. PATENT DOCUMENTS

| | | | |
|---|---|---|---|
| 2015/0097247 A1* | 4/2015 | Cai | H01L 27/0623 257/370 |
| 2017/0084721 A1* | 3/2017 | Hung | H01L 29/66795 |
| 2017/0084741 A1* | 3/2017 | Lin | H01L 29/7842 |

* cited by examiner

*Primary Examiner* — Michael Shingleton
(74) *Attorney, Agent, or Firm* — Amerson Law Firm, PLLC

(57) ABSTRACT

An integrated circuit includes a first transistor, a second transistor and a dummy gate structure. The first transistor includes a first gate structure. The first gate structure includes a first gate insulation layer including a high-k dielectric material and a first gate electrode. The second transistor includes a second gate structure. The second gate structure includes a second gate insulation layer including the high-k dielectric material and a second gate electrode. The dummy gate structure is arranged between the first transistor and the second transistor and substantially does not include the high-k dielectric material.

10 Claims, 19 Drawing Sheets

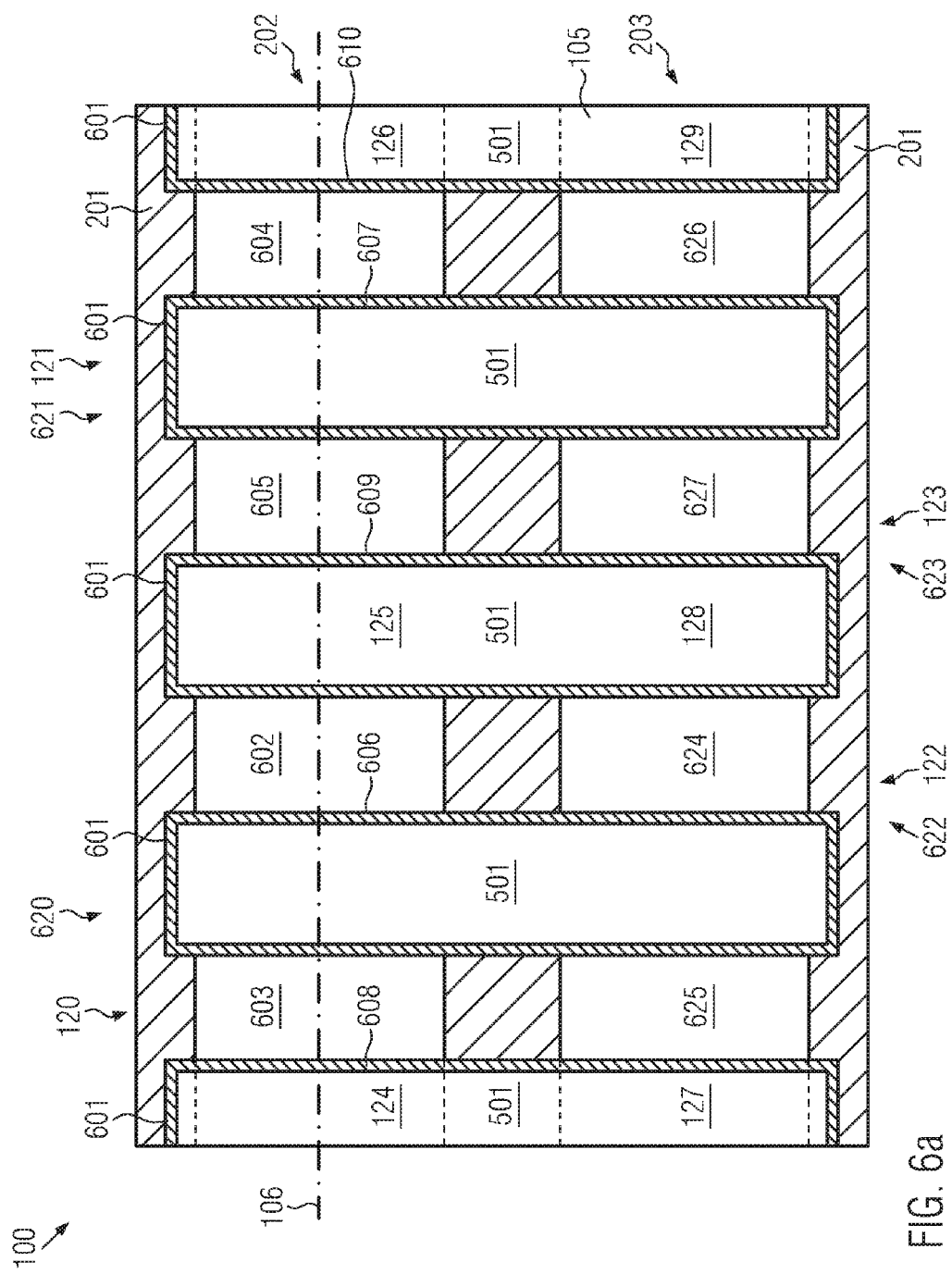

INTEGRATED CIRCUIT INCLUDING A DUMMY GATE STRUCTURE AND METHOD FOR THE FORMATION THEREOF

BACKGROUND OF THE INVENTION

1. Field of the Invention

Generally, the present disclosure relates to integrated circuits and methods for the formation thereof, and, more particularly, to integrated circuits wherein dummy gate structures are provided.

2. Description of the Related Art

Integrated circuits typically include a large number of circuit elements, in particular field effect transistors. In a field effect transistor, a gate structure including a gate electrode and a gate insulation layer that provides electrical insulation between the gate electrode and the channel region may be provided. Adjacent the channel region, a source region and a drain region that are doped differently than the channel region may be provided. Depending on an electric voltage applied to the gate electrode, the field effect transistor can be switched between an ON-state and an OFF-state, wherein an electrical conductivity of the channel region in the ON-state is substantially greater than an electrical conductivity of the channel region in the OFF-state.

Integrated circuits including field effect transistors may be formed in accordance with semiconductor-on-insulator (SOI) technology. In SOI technology, active regions including source, channel and drain regions of the transistors are formed in a relatively thin semiconductor layer that is separated from a support substrate, which may be a semiconductor substrate, by an electrically insulating layer. SOI technology may have some advantages associated therewith, which include a reduced power consumption of an SOI integrated circuit compared to a bulk semiconductor integrated circuit having the same performance. A further improvement of the performance of an integrated circuit may be obtained by fully depleted SOI (FDSOI) technology, wherein the semiconductor layer has a relatively small thickness so that a full depletion of the channel regions of the field effect transistors can be obtained.

For reducing leakage currents of field effect transistors while maintaining a relatively high capacity between the gate electrode and the channel region, gate insulation layers including high-k materials such as, for example, hafnium dioxide, may be used, which may be combined with gate electrodes including metals having a workfunction that matches the type of the field effect transistors (P-channel or N-channel, respectively). For providing an electrical isolation between adjacent field effect transistors, shallow trench isolation (STI) structures may be employed. Shallow trench isolation structures may be formed by forming trenches extending through the semiconductor layer and the electrically insulating layer into the support substrate of the SOI structure. The trenches may be filled with an electrically insulating material such as, for example, silicon dioxide. When shallow trench isolation structures are formed in accordance with known techniques, a non-planar topography of the surface of the electrically insulating material in the trenches may be obtained.

In some examples of integrated circuits, dummy gate structures may be formed over shallow trench isolation structures. The dummy gate structures may have a configuration corresponding to the configuration of gate structures that are provided in field effect transistors. In particular, each of the dummy gate structures may include a dummy gate insulation layer that includes a high-k dielectric material and a workfunction adjustment metal layer. Providing dummy gate structures over shallow trench isolation structures may help to provide a relatively uniform spacing between adjacent ones of the gate structures and the dummy gate structures in the integrated circuit. This may have some advantages when the gate structures and dummy gate structures are formed by means of patterning processes including photolithography, such as, for example, an improved dimensional accuracy.

However, forming dummy gate structures over shallow trench isolation structures as described above may have some issues associated therewith, which may be related to the topography of the surfaces of the shallow trench isolation structures. The topography of the shallow trench isolation structures may cause difficulties in the patterning of the dummy gate structures. Furthermore, the topography of the shallow trench isolation structures may increase a likelihood of high-k or metal gate footing occurring, wherein residues of high-k dielectric materials that are employed for the formation of the dummy gate insulation layers or metals used for the formation of the workfunction adjustment metal layers remain on portions of the shallow trench isolation structures adjacent the dummy gate structures. Moreover, forming dummy gate structures over shallow trench isolation structures may be associated with limitations of the pitch between adjacent gate and dummy gate structures.

In view of the situation described above, the present disclosure provides integrated circuits and methods for the formation thereof that may help to substantially avoid or at least reduce some or all of the above-mentioned issues.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative integrated circuit disclosed herein includes a first transistor, a second transistor and a dummy gate structure. The first transistor includes a first gate structure. The first gate structure includes a first gate insulation layer including a high-k dielectric material and a first gate electrode. The second transistor includes a second gate structure. The second gate structure includes a second gate insulation layer including the high-k dielectric material and a second gate electrode. The dummy gate structure is arranged between the first transistor and the second transistor and substantially does not include the high-k dielectric material.

An illustrative method disclosed herein includes depositing a layer of a high-k material and a layer of a workfunction adjustment metal over a first transistor region, a second transistor region and a dummy gate region of a semiconductor structure. The layer of the workfunction adjustment metal and the layer of the high-k material are patterned, wherein portions of the layer of the workfunction adjustment metal and the layer of the high-k material over the dummy gate region are removed. A gate electrode stack is formed. The gate electrode stack and portions of the layer of the workfunction adjustment metal and the layer of the high-k material over the first transistor region and the second transistor region are patterned. In doing so, a first gate structure over the first transistor region, a second gate structure over the second transistor region and a dummy gate structure over the dummy gate region are formed. An integrated circuit is formed on the basis of the semiconductor structure, wherein the dummy gate structure is not removed.

BRIEF DESCRIPTION OF THE DRAWINGS

The disclosure may be understood by reference to the following description taken in conjunction with the accompanying drawings, in which like reference numerals identify like elements, and in which.

Figure 1A:
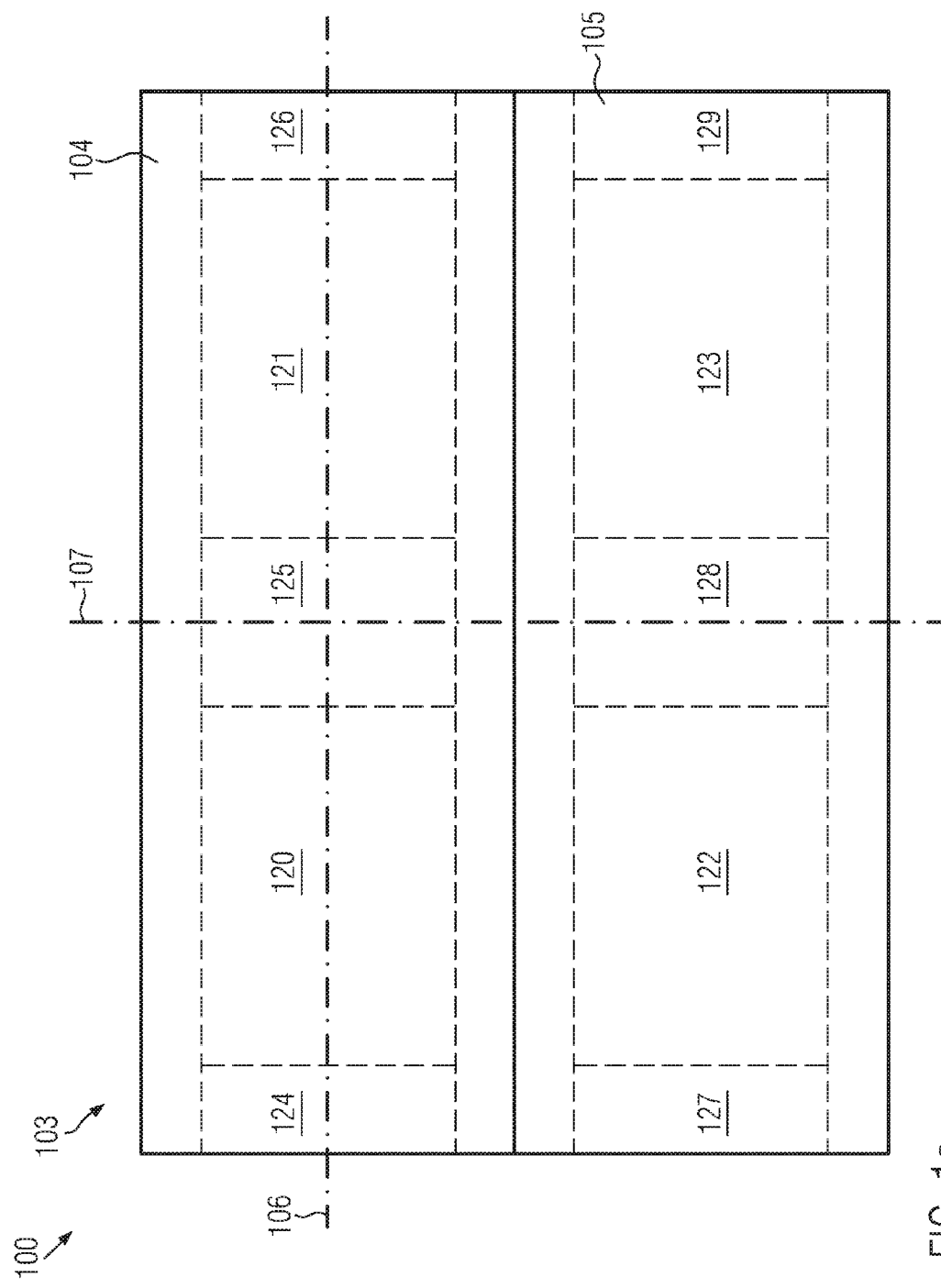
FIGS. 1a-7b show schematic views of a semiconductor structure in stages of a method according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

In embodiments disclosed herein, two or more field effect transistors may be formed at a continuous active region that is provided in a semiconductor layer including one or more semiconductor materials, such as, for example, silicon and/or silicon germanium. Rather than using shallow trench isolation structures over which dummy gate structures are placed for providing electrical insulation between adjacent field effect transistors, dummy gate structures that do not include a high-k material and/or a workfunction adjustment metal may be provided over dummy channel regions provided in the semiconductor material of the continuous active region. The dummy gate structures, dummy channel regions and source and drain regions of transistors adjacent to the dummy gate structures may have a configuration corresponding to a configuration of a field effect transistor, and are sometimes denoted as "dummy transistors" herein. The dummy transistors may be so-called "extremely cold transistors" that are configured such that they are substantially always in their OFF-state and provide electrical insulation between transistors on opposite sides of the dummy gate structures. The dummy gate structures may include gate insulation layers that do not include a high-k material, for example, gate insulation layers formed of silicon dioxide and/or silicon oxynitride, and polysilicon or amorphous silicon gate electrodes which may be highly doped.

For forming the dummy gate structures and the gate structures of the field effect transistors, after a deposition of a layer of a high-k material and a layer of a workfunction adjustment metal, a protection layer, for example, a silicon nitride layer, may be deposited. Techniques of photolithography and etching may be employed to open areas where the dummy gate structures are to be formed, and the protection layer, the layer of the workfunction adjustment metal and the layer of the high-k material may be removed from the areas where the dummy gate structures are to be formed. Thereafter, a photoresist strip process may be performed, wherein the protection layer can protect the layer of the workfunction adjustment metal and the layer of the high-k material. Thereafter, the protection layer may be removed, and a rest of a gate stack may be deposited. Then, patterning processes may be performed for forming the gate structures of the field effect transistors and the dummy gate structures, and further front-end-of-line, middle-of-line and back-end-of-line processes may be performed for completing the formation of an integrated circuit on the basis of the semiconductor structure.

As an alternative to using continuous active regions, non-continuous active regions separated by shallow trench isolation structures may be employed, wherein the high-k material and/or the workfunction adjustment metal is removed from the shallow trench isolation structures so that dummy gate structures that do not include a high-k material and/or a workfunction adjustment metal are formed over dummy gate regions provided by the shallow trench isolation structures.

Figure 1B:
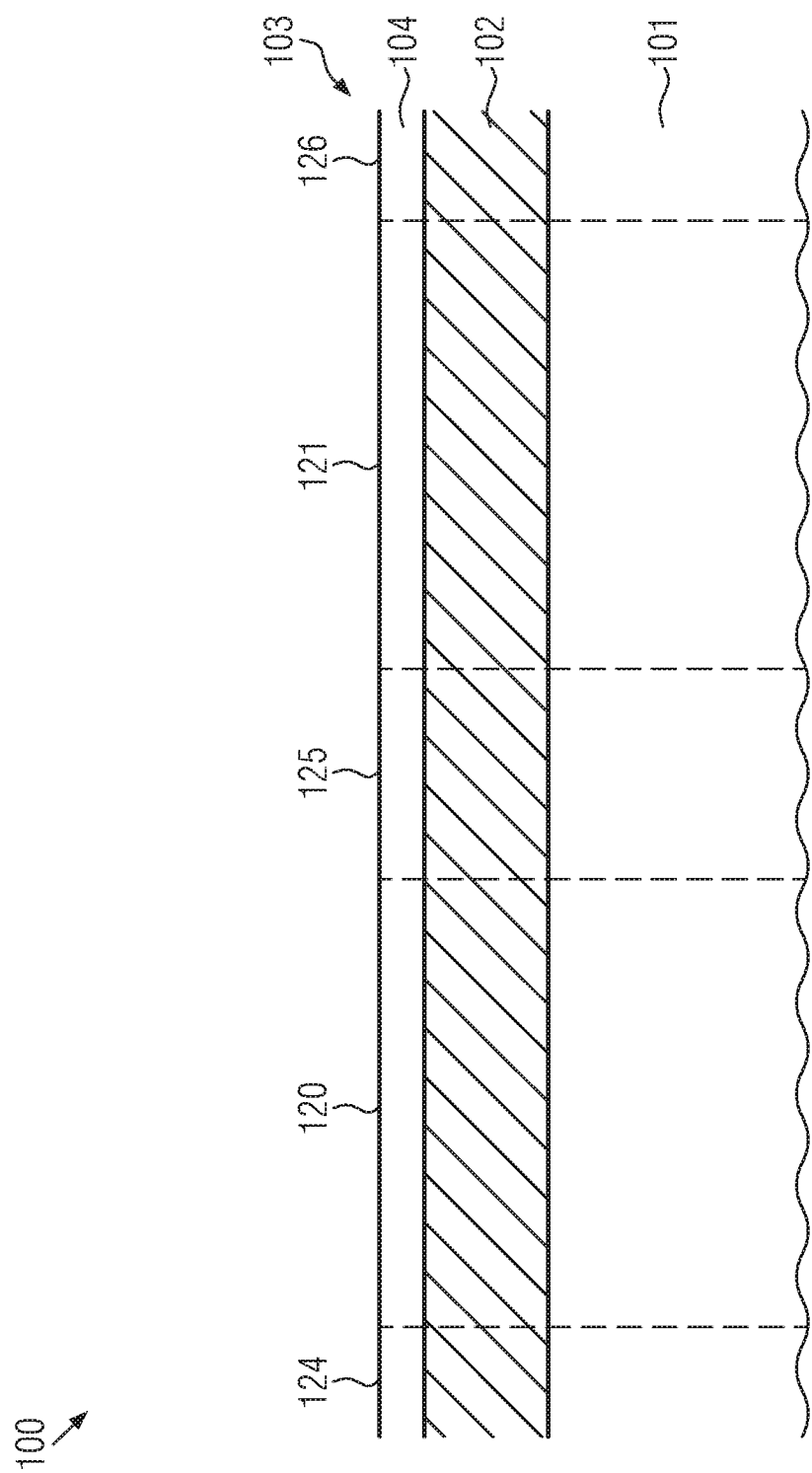
Figure 1C:
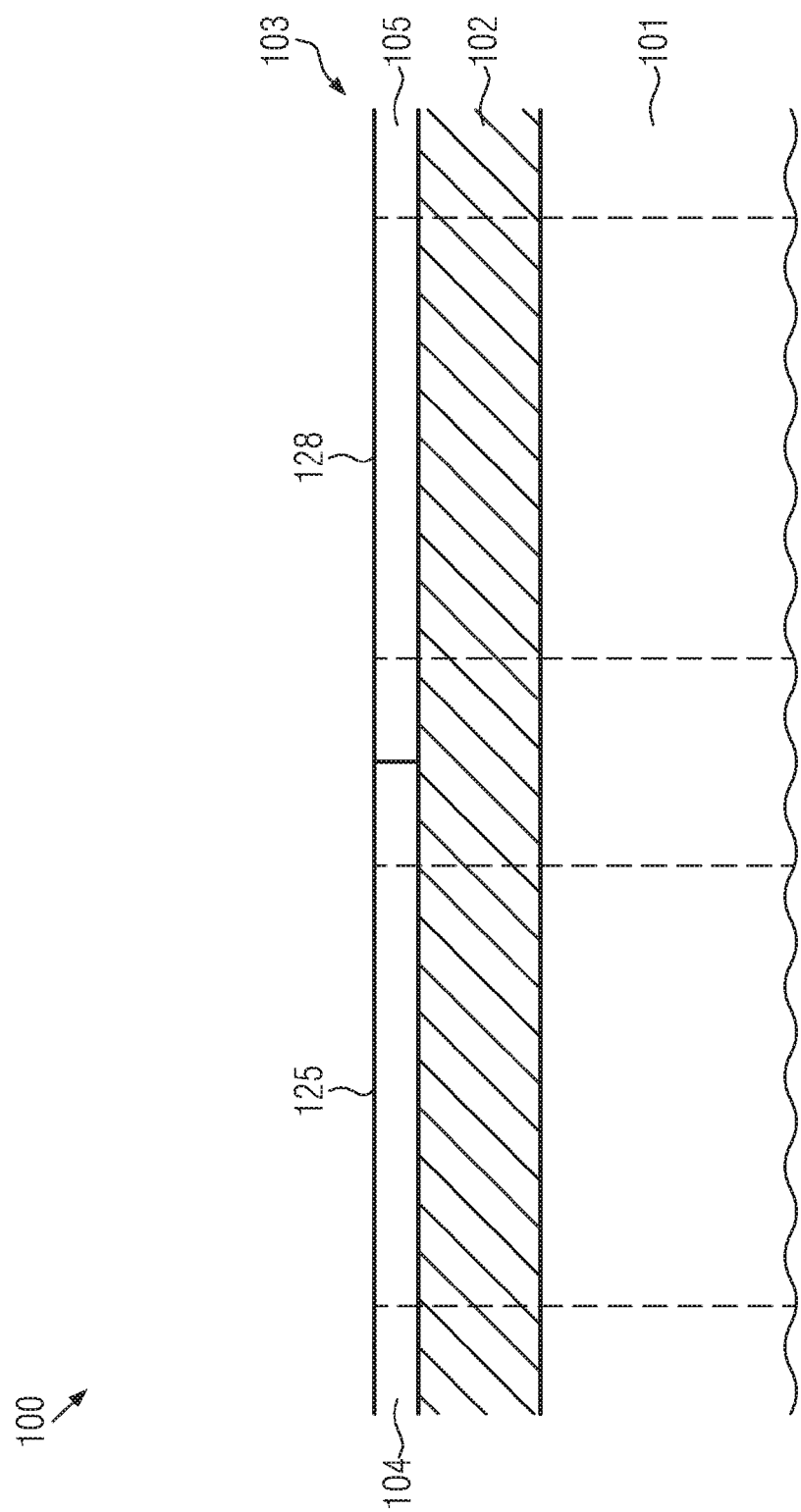

FIG. 1a shows a schematic top view of a portion of a semiconductor structure 100 at a stage of a method according to an embodiment. In the method, an integrated circuit will be formed on the basis of the semiconductor structure 100. Herein, the term "integrated circuit" will be used to denote a semiconductor device including one or more functional electric circuits, whereas configurations obtained during the manufacturing of an integrated circuit which need not include a functional electrical circuit will be denoted as "semiconductor structure." Schematic cross-sectional views of the semiconductor structure 100 at the stage of the method shown in FIG. 1a are shown in FIGS. 1b and 1c, wherein FIG. 1b shows a schematic cross-section along the line 106 shown in FIG. 1a, and FIG. 1c shows a schematic cross-section along the line 107 shown in FIG. 1a.

The semiconductor structure 100 may include a support substrate 101, which may be a semiconductor wafer, for example a silicon wafer. On the support substrate 101, an electrically insulating layer 102 and a semiconductor layer 103 may be provided. The electrically insulating layer 102 may include an electrically insulating material such as, for example, silicon dioxide. The semiconductor layer 103 may include a silicon portion 104 and a silicon germanium portion 105. The semiconductor layer 103, the electrically insulating layer 102 and the support substrate 101 provide a semiconductor-on-insulator (SOI) structure.

In some embodiments, the SOI structure may be a fully depleted SOI structure, wherein the semiconductor layer 103 has a relatively small thickness in a range from about 5-10 nm, so that a full depletion of channel regions of field effect transistors, which are formed at the semiconductor structure 100 in later stages of the method, may be obtained.

As will be detailed in the following, at the silicon portion 104 of the semiconductor structure 100, N-channel field effect transistors may be formed, and P-channel field effect transistors may be formed at the silicon germanium portion 105. In particular, N-channel transistors 620, 621 (see FIGS. 6a and 6b) may be formed at a transistor region 120 and a transistor region 121, respectively, and P-channel transistors 622, 623 (see FIGS. 6a and 6b) may be formed at a transistor region 122 and a transistor region 123, respectively. In addition to the transistor regions 120, 121, 122, 123, the semiconductor structure 100 may include dummy gate regions 124, 125, 126 at the silicon portion 104 of the semiconductor layer 103 and dummy gate regions 127, 128, 129 at the silicon germanium portion 105 of the semiconductor layer 103. As will be detailed in the following, a dummy gate structure may be formed over each of the dummy gate regions 124 to 129, wherein a dummy channel region will be formed in portions of the semiconductor layer 103 in each of the dummy gate regions 124 to 129. The dummy channel regions formed in the dummy gate regions 124, 125, 126 may provide an electrical insulation between the transistors 620, 621 provided at the silicon portion 104 of the semiconductor layer 103 and between the transistors 620, 621 and other transistors formed at the silicon portion 104. The dummy channel regions formed in the dummy gate regions 127, 128, 129 may provide an electrical insulation between the transistors 622, 623 provided at the silicon germanium portion 105 of the semiconductor layer 103 and between the transistors 622, 623 and other transistors formed at the silicon germanium portion 105. At the stage of the method shown in FIGS. 1a, 1b and 1c, the transistor regions 120, 121, 122, 123 and the dummy gate regions 124 to 129 need not be physically distinguished from each other.

The semiconductor structure 100 as shown in FIGS. 1a, 1b and 1c may be formed by means of known techniques for providing SOT structures having a semiconductor layer including silicon portions and silicon germanium portions, which may include providing an SOT wafer having a silicon layer over the electrically insulating layer 102 and the support substrate 101, forming a layer of silicon germanium over the silicon germanium region 105, performing an oxidation process wherein silicon from the silicon germanium layer is oxidized and the germanium diffuses into portions of the silicon layer therebelow, and removing silicon dioxide formed in the oxidation process. Additionally, a thinning anneal for thinning the semiconductor layer 103 and/or a formation of zero layer alignment marks may be performed.

Figure 2A:
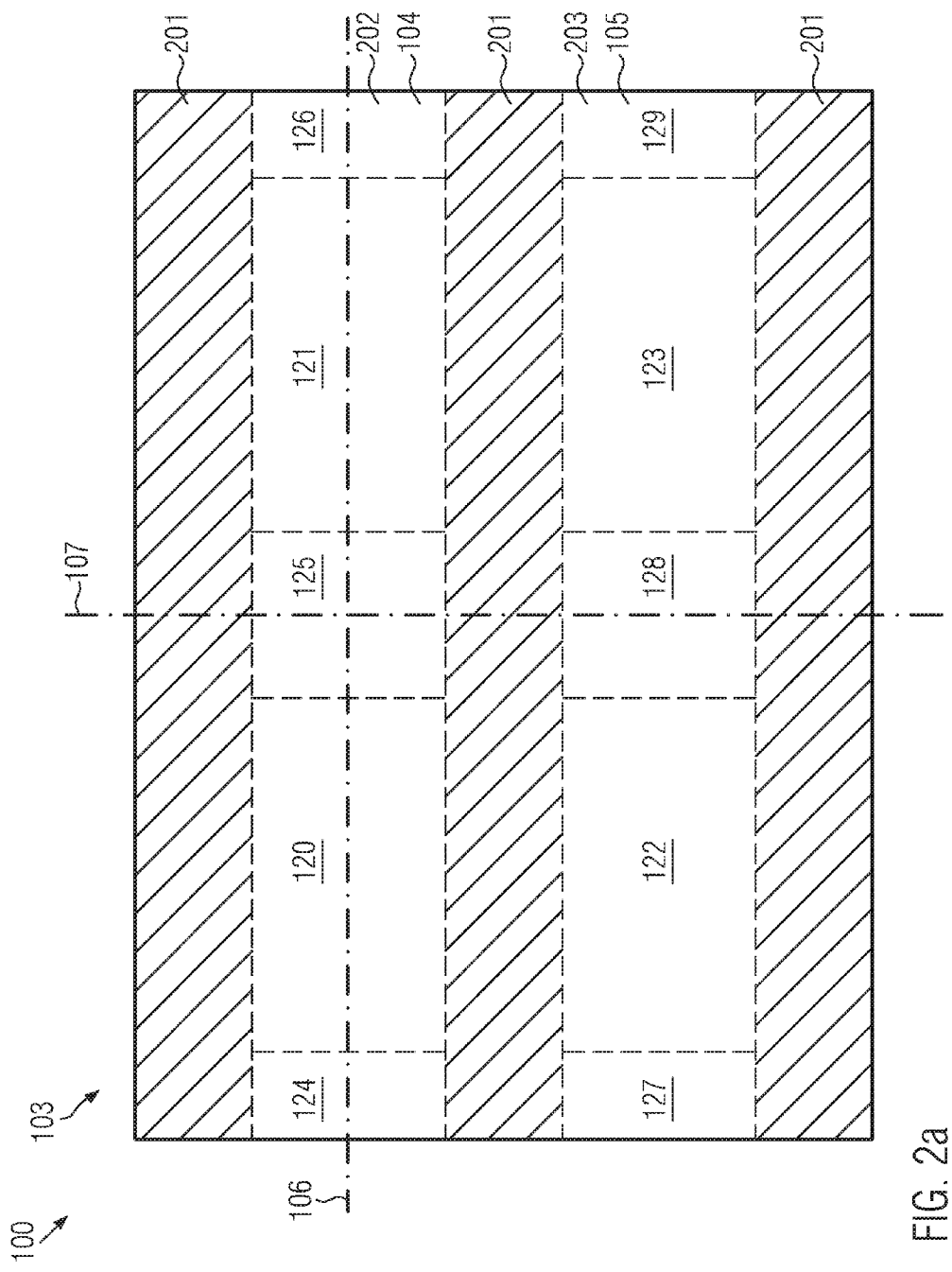
Figure 2B:
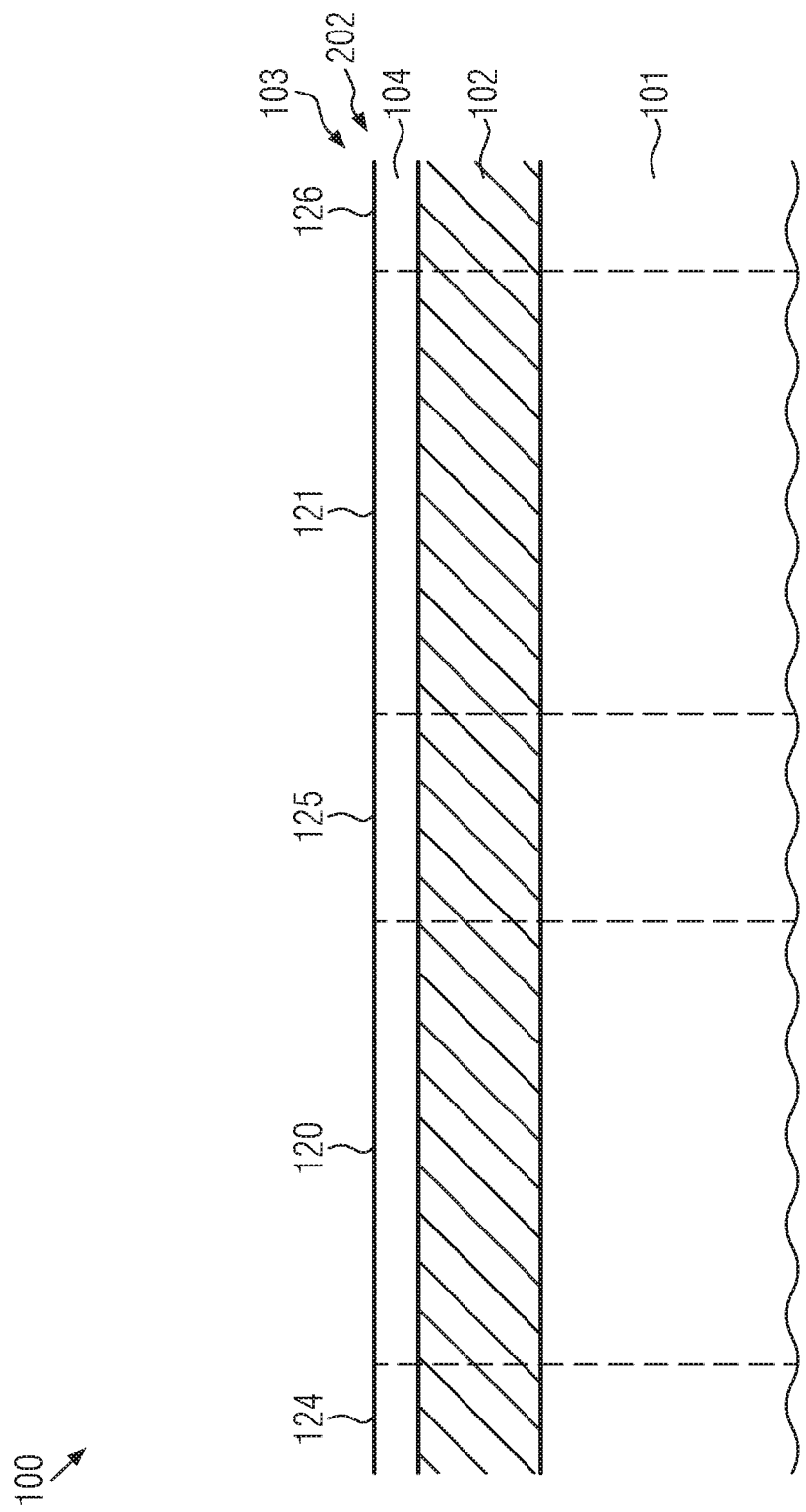
Figure 2C:
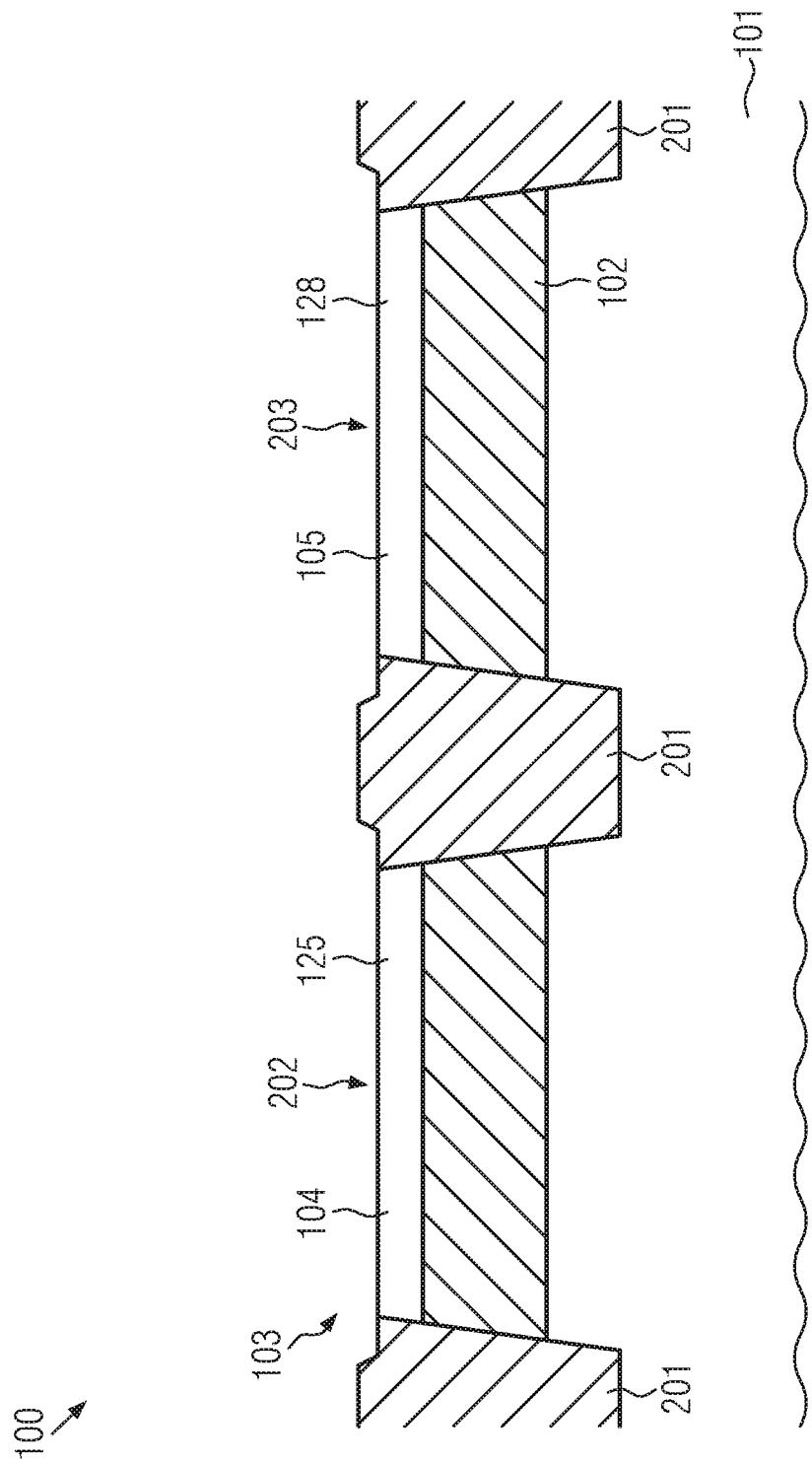

FIGS. 2a, 2b and 2c show schematic views of the semiconductor structure 100 at a later stage of the method, wherein FIG. 2a shows a view corresponding to the view of FIG. 1a, FIG. 2b shows a view corresponding to the view of FIG. 1b, and FIG. 2c shows a view corresponding to the view of FIG. 1c.

A trench isolation structure 201 may be formed. The trench isolation structure 201 may include trenches extending through the semiconductor layer 103 and the electrically insulating layer 102 into the support substrate 101, which are filled with an electrically insulating material such as, for example, silicon dioxide. In the portion of the semiconductor structure 100 shown in FIGS. 2a, 2b and 2c, the trenches of the trench isolation structure 201 may extend along a direction that is horizontal in the top view of FIG. 2a and perpendicular to the plane of drawing of the schematic cross-sectional view of FIG. 2c and which corresponds to a channel length direction of the transistors to be formed in the semiconductor structure 100. The trench isolation structure 201 may separate a continuous active region 202 provided in the silicon portion 104 of the semiconductor layer 103 from a continuous active region 203 provided in the silicon germanium portion 105 of the semiconductor layer 103. Additionally, the trench isolation structure 201 may separate the continuous active regions 202, 203 from other continuous active regions (not shown) in the semiconductor structure 100. However, no portions of the trench isolation structure 201 separating the transistor regions 120, 121 from each other, and no portions of the trench isolation structure 201 separating the transistor regions 122, 123 from each other need to be provided. Thus, the continuous active region 202 may include the transistor regions 120, 121 and the dummy gate regions 124, 125, 126, and the continuous active region 203 may include the transistor regions 122, 123 and the dummy gate regions 127, 128, 129.

For forming the trench isolation structure 201, known techniques for the formation of trench isolation structures may be used. In some embodiments, a pad layer, which may include silicon dioxide, and a hardmask layer, which may include silicon nitride, may be deposited over the semiconductor structure 100. Thereafter, the hardmask layer may be patterned by means of techniques of photolithography and etching for forming a hardmask having openings at locations of the semiconductor structure 100 where the trenches of the trench isolation structure 201 are to be formed. Then, one or more etch processes adapted for removing the semiconductor materials of the semiconductor layer 103 and the materials of the electrically insulating layer 102 and the support substrate 101 may be performed for forming the trenches of the trench isolation structure 201. Thereafter, a layer of an electrically insulating material for filling the trenches of the trench isolation structure 201, for example, a silicon dioxide layer, may be formed by techniques of oxidation and deposition, and processes of chemical mechanical polishing and etching may be performed for removing portions of the electrically insulating material outside the trenches, the hardmask layer and the pad layer.

As can be seen in the schematic cross-sectional view of FIG. 2c, which shows cross-sections of the trench isolation structure 201, a surface of the trench isolation structure 201 may have a non-planar topography, wherein, however, unevennesses of the surface of the trench isolation structure 201 substantially extend in the longitudinal direction of the trenches.

In some embodiments, the trench isolation structure 201 may include trenches of different depths, which may include both shallow trenches and deep trenches, corresponding to the channel length direction of the transistors to be formed in the semiconductor structure 100.

Figure 3A:
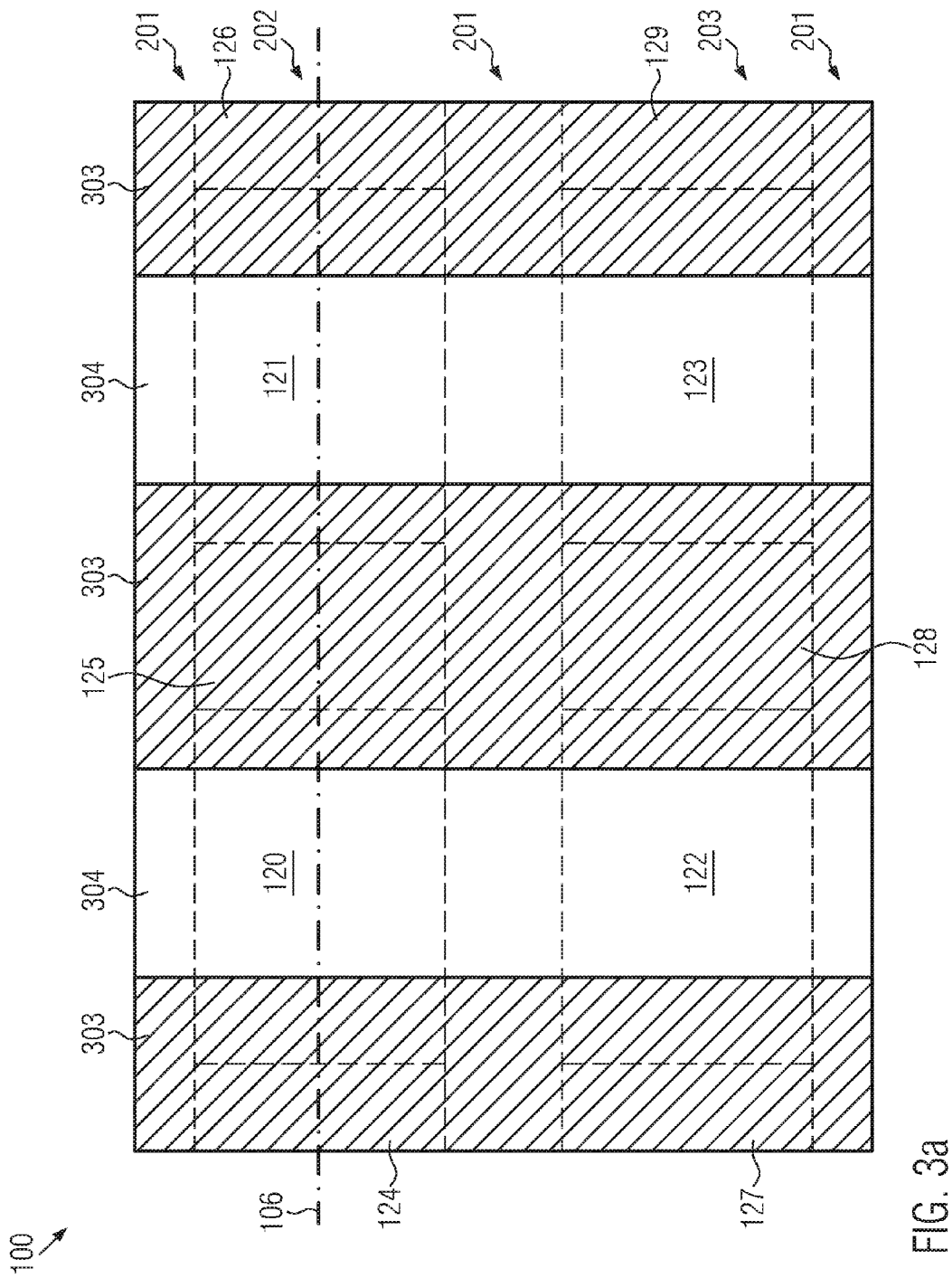
Figure 3B:
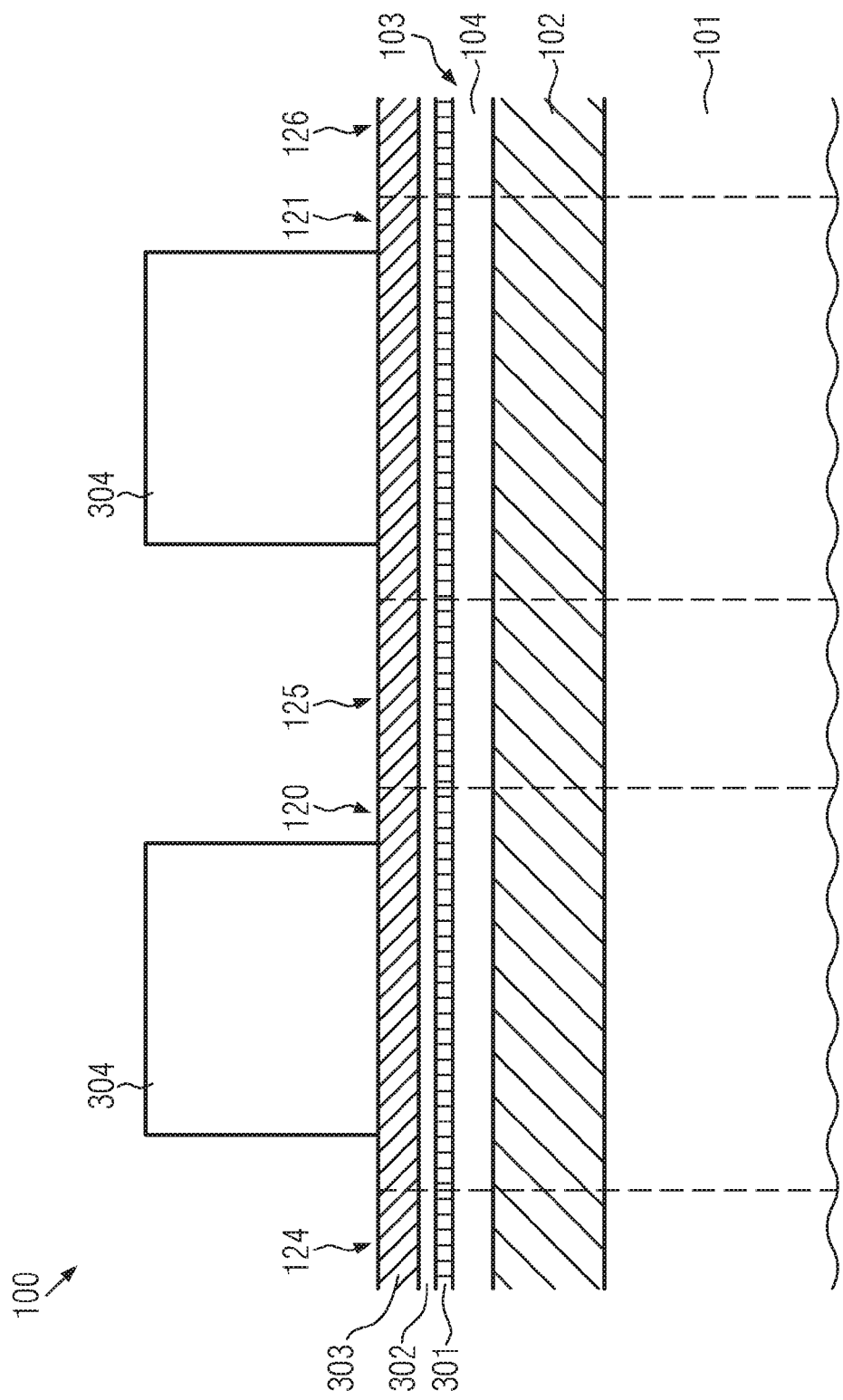

FIGS. 3a and 3b show schematic views of the semiconductor structure 100 at a later stage of the method, wherein FIG. 3a shows a schematic top view corresponding to the view of FIG. 2a, and FIG. 3b shows a schematic cross-sectional view along the line 106, corresponding to the view of FIG. 2b.

After the formation of the trench isolation structure 201, one or more layers of materials of gate insulation layers of the transistors 620, 621, 622, 623 (FIGS. 6a-6b) that are to be formed over the semiconductor structure 100 may be deposited over the semiconductor structure 100. The one or more layers of the materials of the gate insulation layers of the transistors 620, 621, 622, 623 may include, in particular, a layer 301 of a high-k material. In some embodiments, one or more additional layers, such as, for example, a relatively thin silicon dioxide layer below the layer 301 of the high-k material, may be formed, which have been omitted for clarity of illustration in the cross-sectional view of FIG. 3b. The layer 301 of the high-k material may include a dielectric material having a relatively high dielectric constant, for example, a dielectric constant in a range from about 11-30, such as, for example, hafnium dioxide, zirconium dioxide, hafnium silicon oxynitride, zirconium silicon oxynitride and/or hafnium zirconium oxide. The layer 301 of the high-k material may be formed by means of deposition techniques, such as chemical vapor deposition (CVD), plasma-enhanced chemical vapor deposition (PECVD), physical vapor deposition (PVD) and/or atomic layer deposition (ALD).

Over the layer 301 of the high-k material, a layer 302 of a workfunction adjustment metal may be formed. The layer 302 of the workfunction adjustment metal may include a material that is adapted such that the workfunction of the workfunction adjustment metal layer 302 matches the workfunction of the respective portion of the semiconductor layer 103, in accordance with workfunction requirements for obtaining a desirable threshold voltage of the transistors 620, 621, 622, 623 that are formed in the semiconductor structure 100. In some embodiments, the layer 302 of the workfunction adjustment metal may include titanium nitride. For forming the layer 302 of the workfunction adjustment metal, deposition techniques such as CVD, PECVD and/or PVD may be used.

After the deposition of the layer 301 of the high-k material and the layer 302 of the workfunction adjustment metal, the layer 302 of the workfunction adjustment metal and the layer 301 of the high-k material may be patterned. For this purpose, a protection layer 303 may be formed over the semiconductor structure 100. In some embodiments, the protection layer 303 may include silicon nitride. In other embodiments, the protection layer 303 may include polysilicon or amorphous silicon. The protection layer 303 may be formed by means of deposition techniques such as CVD or PECVD.

Thereafter, a photoresist mask 304 may be formed over the protection layer 303. The photoresist mask 304 may be formed by means of techniques of photolithography. The photoresist mask 304 may cover portions of the transistor regions 120, 121, 122, 123 over which gate structures 606, 607 of the transistors 620, 621, 622, 623 are formed. As can be seen in the top view of the semiconductor structure 100 at a later stage of the method shown in FIG. 6a, a common gate structure 606 of the transistors 620, 622 and a common gate structure 607 of the transistors 621, 623 may be formed. Accordingly, the photoresist mask 304 may include a portion extending across the transistor regions 120, 122 and a portion of the trench isolation structure 201 therebetween and a portion extending across the transistor regions 121, 123 and a portion of the trench isolation structure 201 therebetween. Extensions of the portions of the photoresist mask 304 in the channel length direction of the transistors 620, 621, 622, 623 (horizontal in the views of FIGS. 3a and 3b) may be greater than the extensions of the gate structures 606, 607 in the channel length direction. However, the photoresist mask 304 does not cover the dummy gate regions 124 to 129 and portions of the trench isolation structure 201 between adjacent ones of the dummy gate regions 124 to 129, where dummy gate structures 608, 609, 610 (see FIGS. 6a and 6b) are formed. Thus, in some embodiments, the photoresist mask 304 covers portions of the semiconductor structure 100 where the gate structures 606, 607 of the transistors 620 to 623 are formed, but it does not cover portions of the semiconductor structure 100 where the dummy gate structures 608, 609, 610 are formed.

Figure 4A:
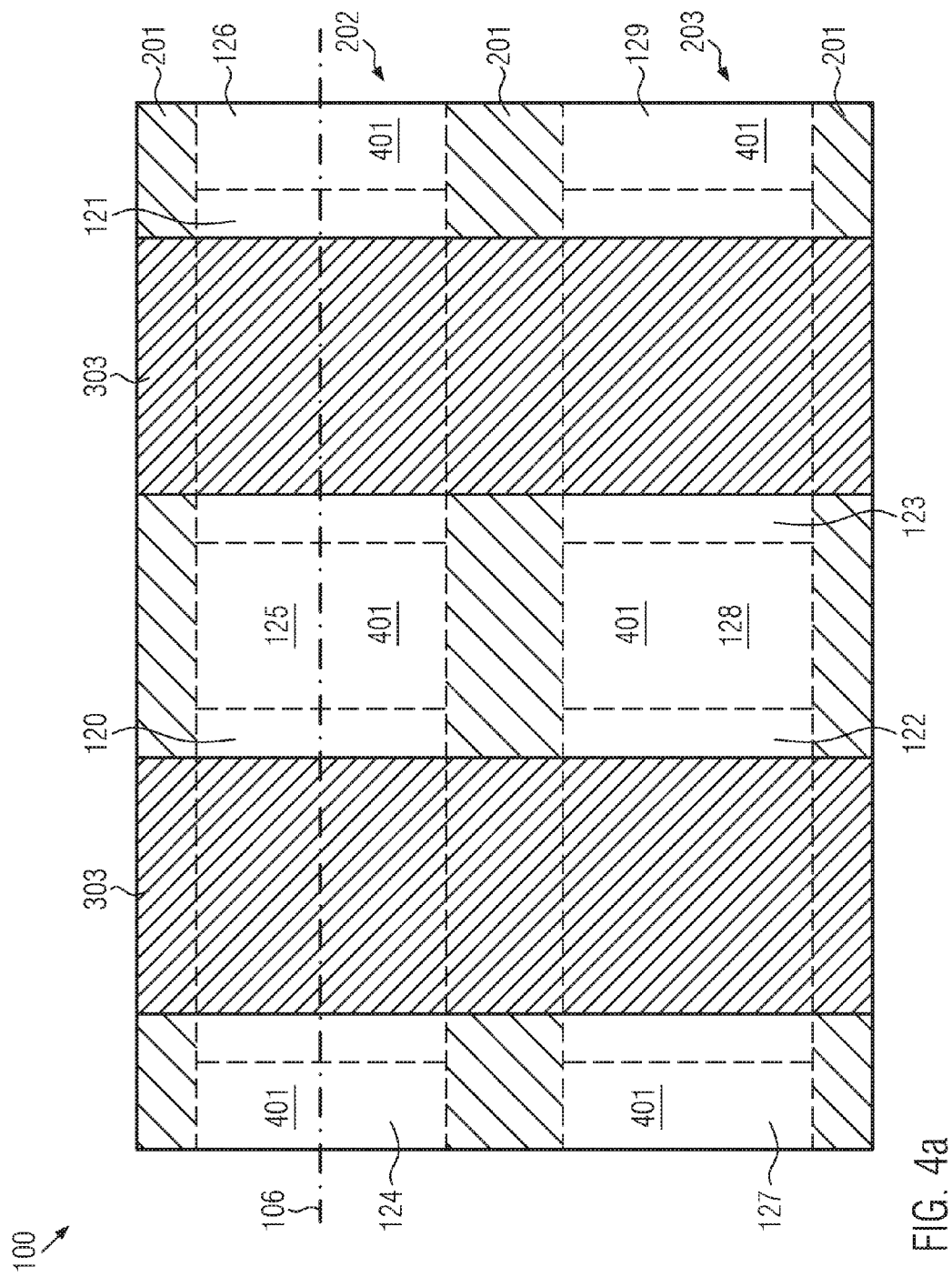
Figure 4B:
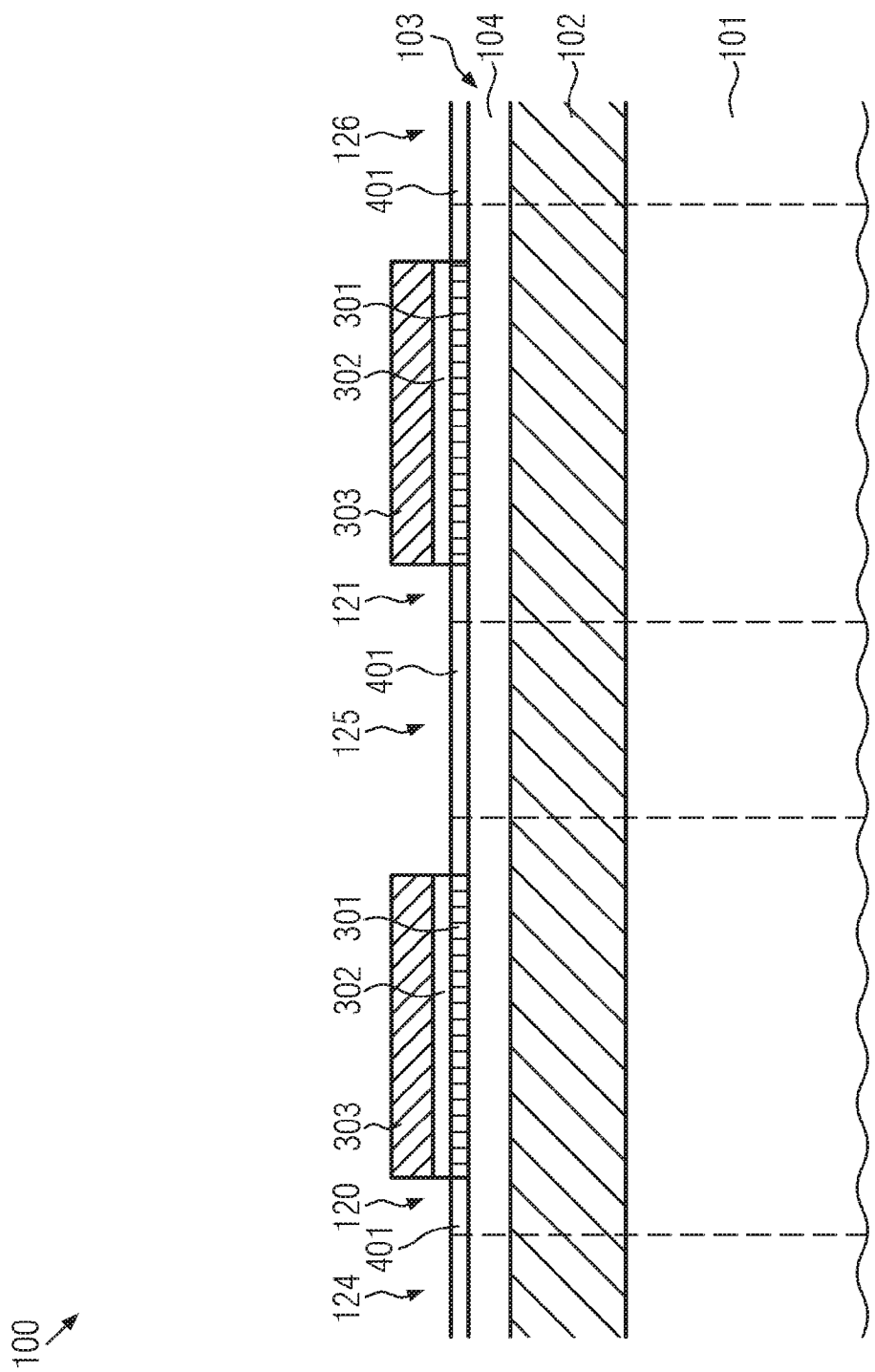

FIGS. 4a and 4b show schematic views of the semiconductor structure 100 corresponding to the views of FIG. 3a and FIG. 3b, respectively, at a later stage of the method. After the formation of the photoresist mask 304, an etch process adapted for removing the material of the protection layer 303, for example a plasma etch process adapted for etching silicon nitride, may be performed. In the etch process, portions of the protection layer 303 that are not covered by the photoresist mask 304 may be removed. Thereafter, one or more etch processes adapted for removing the materials of the layer 302 of the workfunction adjustment metal and the layer 301 of the high-k material, which may include dry etch processes such as plasma etching as well as wet etch processes, may be performed. Thus, portions of the layer 302 of the workfunction adjustment metal and the layer 301 of the high-k material that are not covered by the photoresist mask 304 may be removed from the semiconductor structure 100 so that the semiconductor material of the semiconductor layer 103 is exposed at the surface of the semiconductor structure 100 in the dummy gate regions 124 to 129.

Thereafter, a photoresist strip process may be performed, for example, a plasma ashing process wherein the semiconductor structure 100 is exposed to an oxygen plasma.

After the above-described patterning of the layer 302 of the workfunction adjustment metal and the layer 301 of high-k material, the portions of the transistor regions 120, 121, 122, 123 over which the gate structures 606, 607 of the transistors 620, 621, 622, 623 are formed are covered by the layer 301 of the high-k material and the layer 302 of the workfunction adjustment metal, whereas substantially no high-k material and substantially no workfunction adjustment metal is provided over the dummy gate regions 124 to 129 and the portions of the trench isolation structure 201 therebetween over which the dummy gate structures 608, 609, 610 will be formed.

In FIGS. 4a and 4b, reference numeral 401 denotes a layer of an electrically insulating material having a smaller dielectric constant than the high-k material of the layer 301 of the high-k material. In some embodiments, the layer 401 of the electrically insulating material may include silicon dioxide and/or silicon oxynitride.

The layer 401 of the electrically insulating material may include silicon dioxide. In some embodiments, the layer 401 of electrically insulating material may be formed by means of an oxidation process. Alternatively, the layer 401 of the electrically insulating material may be provided by a native oxide of the semiconductor materials of the semiconductor layer 103. In further embodiments, the layer 401 of electrically insulating material may include silicon oxynitride, and it may be formed by means of a deposition process such as CVD or PECVD.

Figure 5A:
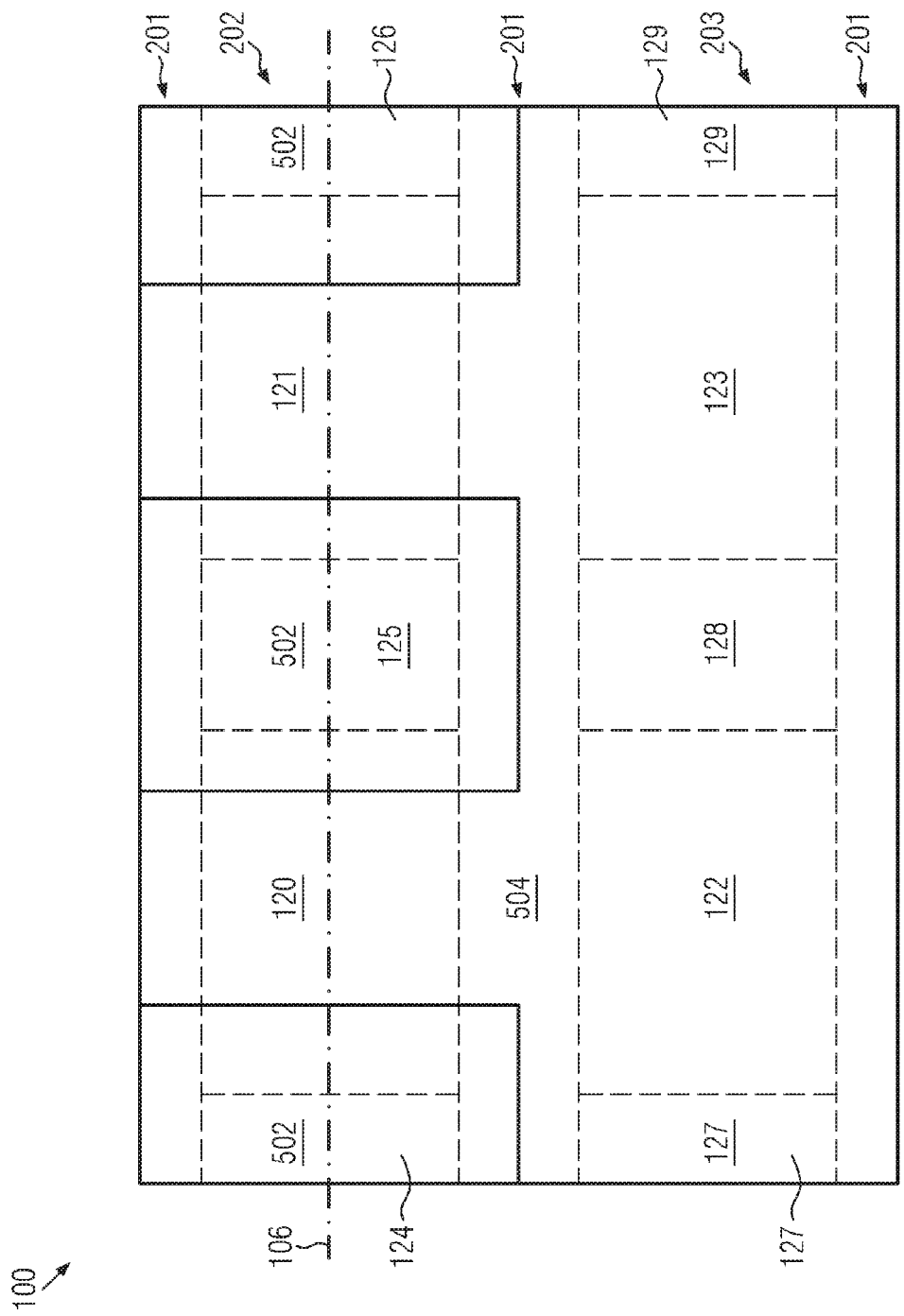
Figure 5B:
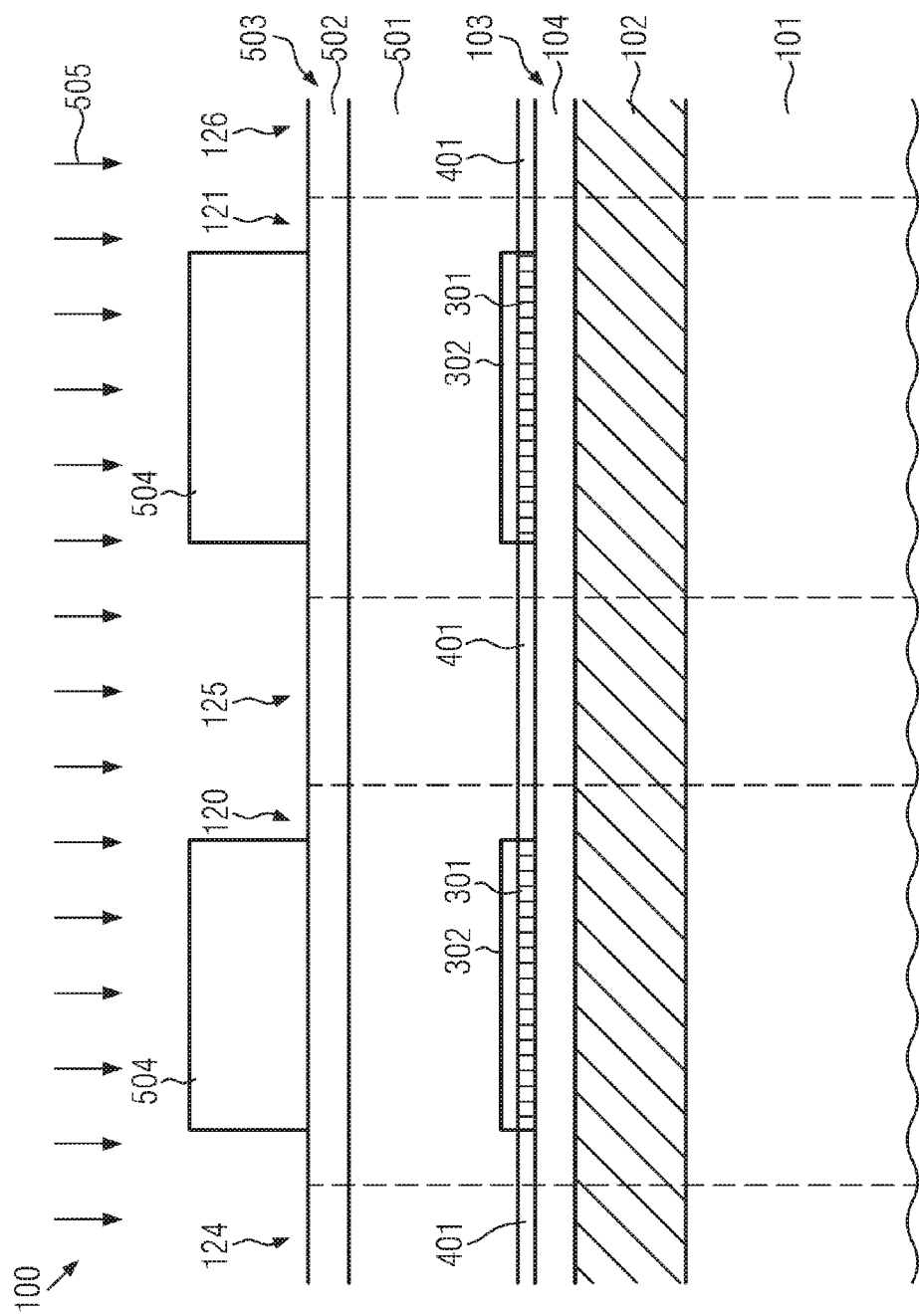

FIGS. 5a and 5b show schematic views of the semiconductor structure 100 at a later stage of the method, wherein FIG. 5a shows a schematic top view corresponding to the view of FIG. 4a, and FIG. 5b shows a schematic cross-sectional view along the line 106 corresponding to the view of FIG. 4b.

After the removal of the portions of the layer 301 of the high-k material and the layer 302 of the workfunction adjustment metal over the dummy gate regions 124 to 129, the photoresist strip process and the formation of the layer 401 of the electrically insulating material, an etch process adapted for selectively removing the material of the protection layer 303 relative to the materials of the layer 302 of the workfunction adjustment metal, the layer 301 of the high-k material and/or the layer 401 of the electrically insulating material may be performed. This may be a wet or dry process adapted for removing silicon nitride. The etch process may remove the portions of the protection layer 303 that were covered by the photoresist mask 304 in the etching of the layer 302 of the workfunction adjustment metal and the layer 301 of the high-k material.

Thereafter, a gate electrode stack 503 may be formed over the semiconductor structure 100. The gate electrode stack 503 may include a polysilicon or amorphous silicon layer 501 and a capping layer 502. The capping layer 502 may include silicon nitride. In some embodiments, more than one capping layer may be provided, for example, an upper capping layer formed of silicon dioxide and a lower capping layer formed of silicon nitride. Thus, reference numeral 502 may denote one or more capping layers of the gate electrode stack 503 that are provided on the polysilicon or amorphous silicon layer 501.

After the formation of the gate electrode stack 503, a photoresist mask 504 may be formed over the capping layer 502. The photoresist mask 504 may be formed by techniques of photolithography. The photoresist mask 504 may have openings over the dummy gate regions 124, 125, 126 at the continuous active region 202. Portions of the transistor regions 120, 121 where the gate structures 606, 607 of the transistors 620, 621, 622, 623 will be formed as well as the continuous active region 203 may be covered by the photoresist mask 504.

After the formation of the photoresist mask 504, an ion implantation process may be performed, which is schematically illustrated by arrows 505 in FIG. 5b. In the ion implantation process 505, the semiconductor structure 100 may be irradiated with ions of a dopant that is provided for doping portions of the dummy gate structures 608, 609, 610 over the continuous active region 202. A type of the dopant that is implanted into the polysilicon or amorphous silicon layer 501 in the ion implantation process 505 and an ion dose may be adapted such that substantially no electrically conductive channels are formed in dummy channel regions which are formed in the silicon portion 104 of the semiconductor layer 103 at the dummy gate regions 124, 125, 126, as detailed below. In some embodiments, in the ion implantation process 505, ions of a P-type dopant, such as boron, may be implanted into the portions of the polysilicon or amorphous silicon layer 501 over the dummy gate regions 124, 125, 126 of the semiconductor structure 100. In some embodiments, an ion dose of the ion implantation process 505 may be in a range from about $10^{14}$ ions/cm$^2$ to about $10^{16}$ ions/cm$^2$ so that a dopant concentration in a range from about $10^{18}$ atoms/cm$^3$ to about $10^{22}$ atoms/cm$^3$ is obtained in the portions of the polysilicon or amorphous silicon layer 501 over the dummy gate regions 124, 125, 126.

After the ion implantation process 505, the photoresist mask 504 may be removed by means of a resist strip process and another photomask (not shown) covering portions of the semiconductor structure 100 other than dummy gate regions 127, 128, 129 at the continuous active region 203 may be formed by means of techniques of photolithography. Thereafter, a further ion implantation process (not shown) may be performed for doping portions of the polysilicon or amorphous silicon layer 501 over the dummy gate regions 127, 128, 129, which will be provided in portions of the dummy gate structures 608, 609, 610 over the continuous active region 203. In the ion implantation process, the semiconductor structure 100 may be irradiated with ions of an N-type dopant, such as phosphorous or arsenic, wherein an ion dose may be in a range from about $10^{14}$ ions/cm$^2$ to about $10^{16}$ ions/cm$^2$ so that a dopant concentration in a range from about $10^{18}$ atoms/cm$^3$ to about $10^{22}$ atoms/cm$^3$ is obtained in the portions of the polysilicon or amorphous silicon layer 501 over the dummy gate regions 127, 128, 129. Thereafter, the photoresist mask may be removed from the semiconductor structure 100 by means of a resist strip process.

Figure 6B:
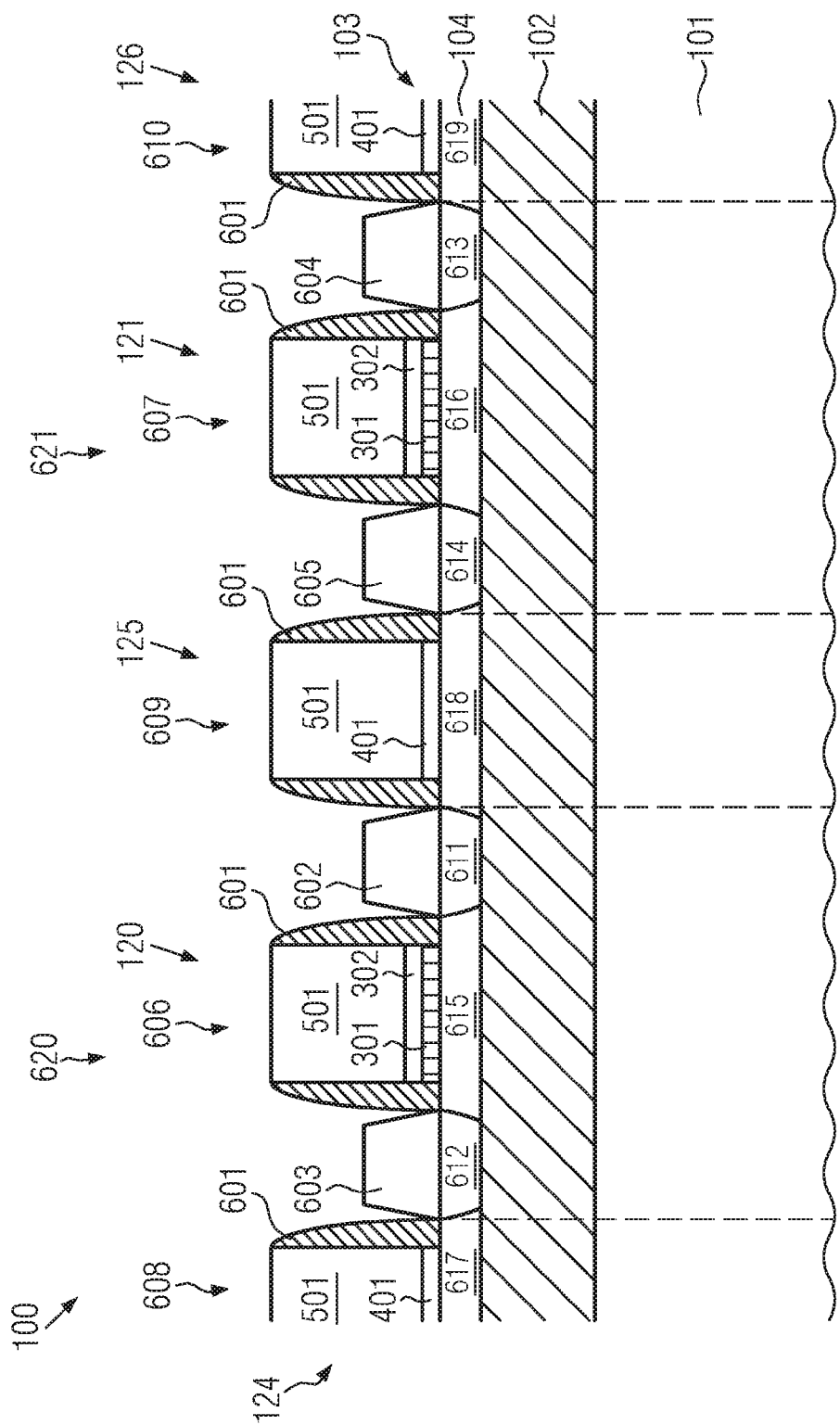

FIGS. 6a and 6b show schematic views of the semiconductor structure 100 in a later stage of the method, wherein FIG. 6a shows a schematic top view corresponding to the view of FIG. 5a, and FIG. 6b shows a schematic cross-sectional view along the line 106 corresponding to the view of FIG. 5b.

After the implantation of ions into portions of the polysilicon or amorphous silicon layer 501, the gate electrode stack 503 may be patterned. Additionally, portions of the layer 302 of the workfunction adjustment metal and the layer 301 of the high-k material over the transistor regions 120, 121, 122, 123 and portions of the layer 401 of the electrically insulating material over the dummy gate regions 124 to 129 may be patterned. This may be done by means of techniques conventionally employed in the patterning of gate stacks for the formation of gate electrodes of field effect transistors, which may include processes of photolithography and one or more etch processes adapted for removing materials of the capping layer 502, the polysilicon or amorphous silicon layer 501, the layer 302 of the workfunction adjustment metal, the layer 301 of the high-k material and the layer 401 of the electrically insulating material. In doing so, a gate structure 606 extending across the transistor regions 120, 122 and the portion of the trench isolation structure 201 therebetween, a gate structure 607 extending across the transistor regions 121, 123 and the portions of the trench isolation structure 201 therebetween, as well as dummy gate structures 608, 609, 610 may be formed. Directly after the formation of the gate structures 606, 607 and the dummy gate structures 608, 609, 610, the gate structures 606, 607 and the dummy gate structures 608, 609, 610 may have portions of the capping layer 502 thereon.

The dummy gate structure 608 may extend across the dummy gate regions 124, 127 and a portion of the trench isolation structure 201 therebetween. The dummy gate structure 608 may have a P-doped portion over the dummy gate region 124 and an N-doped portion over the dummy gate region 127. The dummy gate structure 609 may be provided over the dummy gate regions 125, 128 and the portion of the trench isolation structure 201 therebetween and it may have a P-doped portion over the dummy gate region 125 and an N-doped portion over the dummy gate region 128. The dummy gate structure 610 may be provided over the dummy gate regions 126, 129 and a portion of the trench isolation structure 201 therebetween and it may have a P-doped portion over the dummy gate region 126 and an N-doped portion over the dummy gate region 129. Each of the gate structures 606, 607 may include a portion of the layer 301 of high-k material, which provides a gate insulation layer, and a portion of the layer 302 of the workfunction adjustment metal which, in combination with a portion of the polysilicon or amorphous silicon layer 501 in the respective gate structure, provides a gate electrode. In the dummy gate structures 608, 609, 610, no portions of the layer 301 of the high-k material and the layer 302 of the workfunction adjustment metal need to be provided. Instead, each of the dummy gate structures 608, 609, 610 may include a dummy gate insulation layer that is provided by a portion of the layer 401 of the electrically insulating material having a smaller dielectric constant than the high-k dielectric material of the layer 301 and a doped polysilicon or amorphous silicon dummy gate electrode that is formed from a portion of the polysilicon or amorphous silicon layer 501.

After the formation of the gate structures 606, 607 and the dummy gate structures 608, 609, 610, a sidewall spacer 601 may be formed adjacent each of the gate structures 606, 607 and the dummy gate structures 608, 609, 610. For this purpose, a layer of a sidewall spacer material such as, for example, silicon nitride, silicon borocarbonitride and/or silicon carbonitride may be deposited over the semiconductor structure 100 by means of a substantially isotropic deposition process such as CVD or PECVD. Thereafter, an anisotropic etch process may be performed for removing portions of the layer of sidewall spacer material over substantially horizontal portions of the semiconductor structure 100, such as exposed portions of the semiconductor layer 103 and the trench isolation structure 102 as well as the capping layer 502. Portions of the layer of the sidewall spacer material at sidewalls of the gate structures 606, 607 and the dummy gate structures 608, 609, 610 remain in the semiconductor structure 100 and form the sidewall spacer 601.

After the formation of the sidewall spacer 601, a raised source region 602 and a raised drain region 603 may be formed over the transistor region 120, and a raised source region 604 and a raised drain region 605 may be formed over the transistor region 121. Each of the raised source regions 602, 604 and the raised drain regions 603, 605 may include an N-doped semiconductor material such as silicon.

Over the transistor region 122, a raised source region 624 and a raised drain region 625 may be formed. Similarly, over the transistor region 123, a raised source region 626 and a raised drain region 627 may be formed. The raised source regions 624, 626 and the raised drain regions 625, 627 may be formed of a P-doped semiconductor material such as, for example, silicon or silicon germanium. For forming the raised source regions 602, 604, 624, 626 and the raised drain regions 603, 605, 625, 627, selective epitaxial growth processes adapted for selectively depositing doped semiconductor materials over the portions of the semiconductor layer 103 that are not covered by the gate structures 606, 607 and the dummy gate structures 608, 609, 610 may be performed. For providing a different doping and/or a different semiconductor material in the raised source regions 602, 604 and raised drain regions 603, 605, on the one hand, and the raised source regions 624, 626 and the raised drain regions 625, 627, on the other hand, two separate selective epitaxial growth processes may be performed, wherein, during each of the selective epitaxial growth processes, one of the continuous active regions 202, 203 is covered by a hardmask so that doped semiconductor material is deposited substantially only over the other of the continuous active regions 202, 203. After each of the selective epitaxial growth processes, the respective hardmask may be removed by an etch process.

After the formation of the raised source regions 602, 604, 624, 626 and the raised drain regions 603, 605, 625, 627, an annealing process may be performed, wherein dopants from the raised source regions 602, 604, 624, 626 and the raised drain regions 603, 605, 625, 627 are diffused into the portions of the semiconductor layer 103 therebelow. Thus, a source region 611 may be formed below the raised source region 602, and a drain region 612 may be formed below the raised drain region 603. Portions of the semiconductor layer 103 below the gate structure 606 provide a channel region 615 of the transistor 620 that is formed at the transistor region 120. Similarly, in the transistor region 121, a source region 613 below the raised source region 604, a drain region 614 below the raised drain region 605 and a channel region 616 below the gate structure 607 may be formed. Thus, the transistor 621 is provided in the transistor region 121.

In the transistor regions 122, 123, a diffusion of dopants into portions of the semiconductor layer 103 below the raised source regions 624, 626 and the raised drain regions 625, 627 may also be obtained so that transistors 622, 623 having source, channel and drain regions are formed in the transistor regions 122, 123.

Below the dummy gate structures 608, 609, 610, dummy channel regions 617, 618, 619 may be formed in the continuous active region 202.

The channel regions 615, 616 and the dummy channel regions 617, 618, 619 may have a doping that is different from the doping of the source regions 611, 613 and the drain regions 612, 614. In some embodiments, the channel regions 615, 616 and the dummy channel regions 617, 618, 619 may be substantially undoped. In other embodiments, the channel regions 615, 616 and the dummy channel regions 617, 618, 619 may have a P-type doping that is opposite the N-type doping of the source regions 611, 613 and the drain regions 612, 614.

Similarly, in the continuous active region 203, channel regions may be provided below the gate structures 606, 607, and dummy channel regions may be provided below the dummy gate structures 608, 609, 610, wherein the channel regions and dummy channel regions are substantially undoped or have an N-type doping that is opposite to the P-type doping of the source and drain regions that are provided below the raised source regions 624, 626 and the raised drain regions 625, 627.

In some embodiments, the doping of the channel regions and the dummy channel regions in the continuous active region 202 and the continuous active region 203 may correspond to a base doping of the silicon portion 104 and a base doping of the silicon germanium portion 105 of the semiconductor layer 103, respectively.

The source region 611 of the transistor 620, the dummy channel region 618, the drain region 614 of the transistor 621 and the dummy gate structure 609 have a configuration corresponding to that of a field effect transistor, wherein the portion of the polysilicon or amorphous silicon layer 501 in the dummy gate structure 609 provides a dummy gate electrode, and the portion of the layer 401 of electrically insulating material in the dummy gate structure 609 provides a dummy gate insulation layer. Thus, an electrical conductivity of the dummy channel region 618 may depend on an electric field configuration at the portion of the polysilicon or amorphous silicon layer 501 in the dummy gate structure 609, the portion of the electrically insulating layer 401 in the dummy gate structure 609 and the dummy channel region 618. Due to the above-described doping of the portion of the polysilicon or amorphous silicon layer 501 in the dummy gate structure 609, and due to the absence of a high-k material and a workfunction adjustment metal in the dummy gate structure 609, the dummy transistor provided by the source region 611, the dummy channel region 618, the drain region 614 and the dummy gate structure 609 may be an enhancement-type field effect transistor having a relatively high threshold voltage that is greater than threshold voltages of the transistors 620, 621 and which, in the absence of any voltage applied to the portion of the polysilicon or amorphous silicon layer 501 in the dummy gate structure 609, is in an electrically substantially non-conductive OFF-state. Thus, an electrical insulation may be provided between the transistors 620, 621. Hence, no portion of the trench isolation structure 201 extending in the channel width direction of the transistors 620, 621 (vertical in the plane of drawing of FIG. 6a) needs to be provided between the transistors 620, 621 for providing an electrical insulation of the transistors 620, 621 from each other. Thus, issues caused by such portions of the trench isolation structure 201, such as, for example, a high-k footing, may be substantially avoided or at least reduced. Portions of the trench isolation structure 201 extending in the channel length direction of the transistors 620, 621, 622, 623 (horizontal in the plane of drawing of FIG. 6a) may be less susceptible to high-k footing, due to the orientation of the topography of the trench isolation structure 201 perpendicular to the length direction of the gate structures 606, 607 and the dummy gate structures 608, 609, 610.

Similarly, at the dummy gate structures 608, 610, a dummy transistor configuration may be obtained so that an electrical insulation between the transistors 620, 621 and further transistors at the continuous active region 202 (not shown) may be provided. Moreover, at the portions of the dummy gate structures 608, 609, 610 over the continuous active region 203, a dummy transistor configuration corresponding to a configuration of P-channel transistors having a greater threshold voltage than the transistors 622, 623 may be obtained so that an electrical insulation between the transistor 622 and the transistor 623 and between the transistors 622, 623 and further transistors (not shown) at the continuous active region 203 may be obtained.

After the formation of the raised source regions 602, 604, 624, 626 and the raised drain regions 603, 605, 625, 627 and the diffusion of dopants from the raised source regions 602, 604, 624, 626 and the raised drain regions 603, 605, 625, 627 into portions of the semiconductor layer 103 therebelow, a cap removal etch process, which may be a wet or dry etch process adapted for selectively removing the material of the capping layer 502, may be performed so that the portions of the polysilicon or amorphous silicon layer 501 in the gate structures 606, 607 and the dummy gate structures 608, 609, 610 are exposed at the surface of the semiconductor structure 100.

Figure 7A:
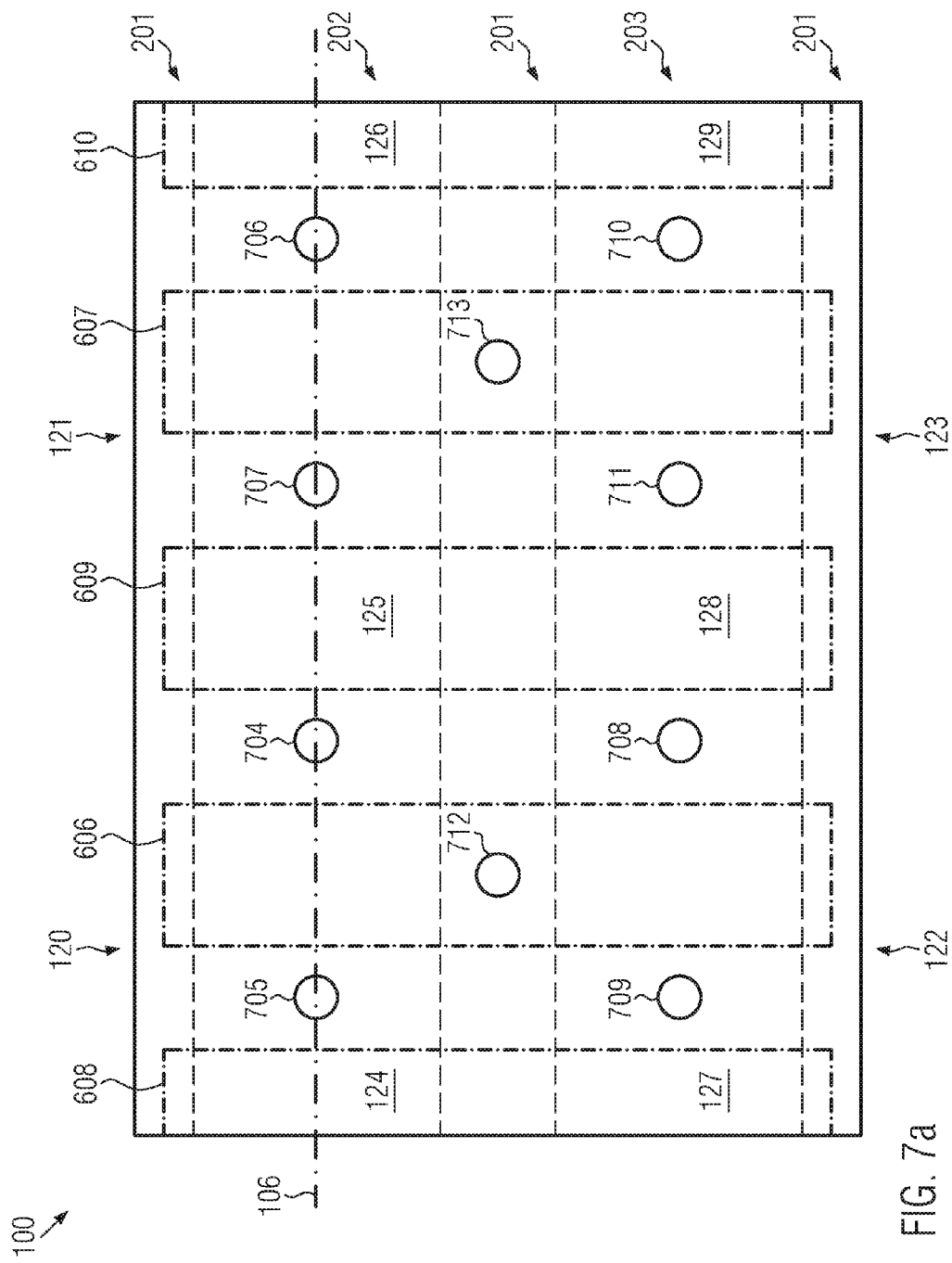
Figure 7B:
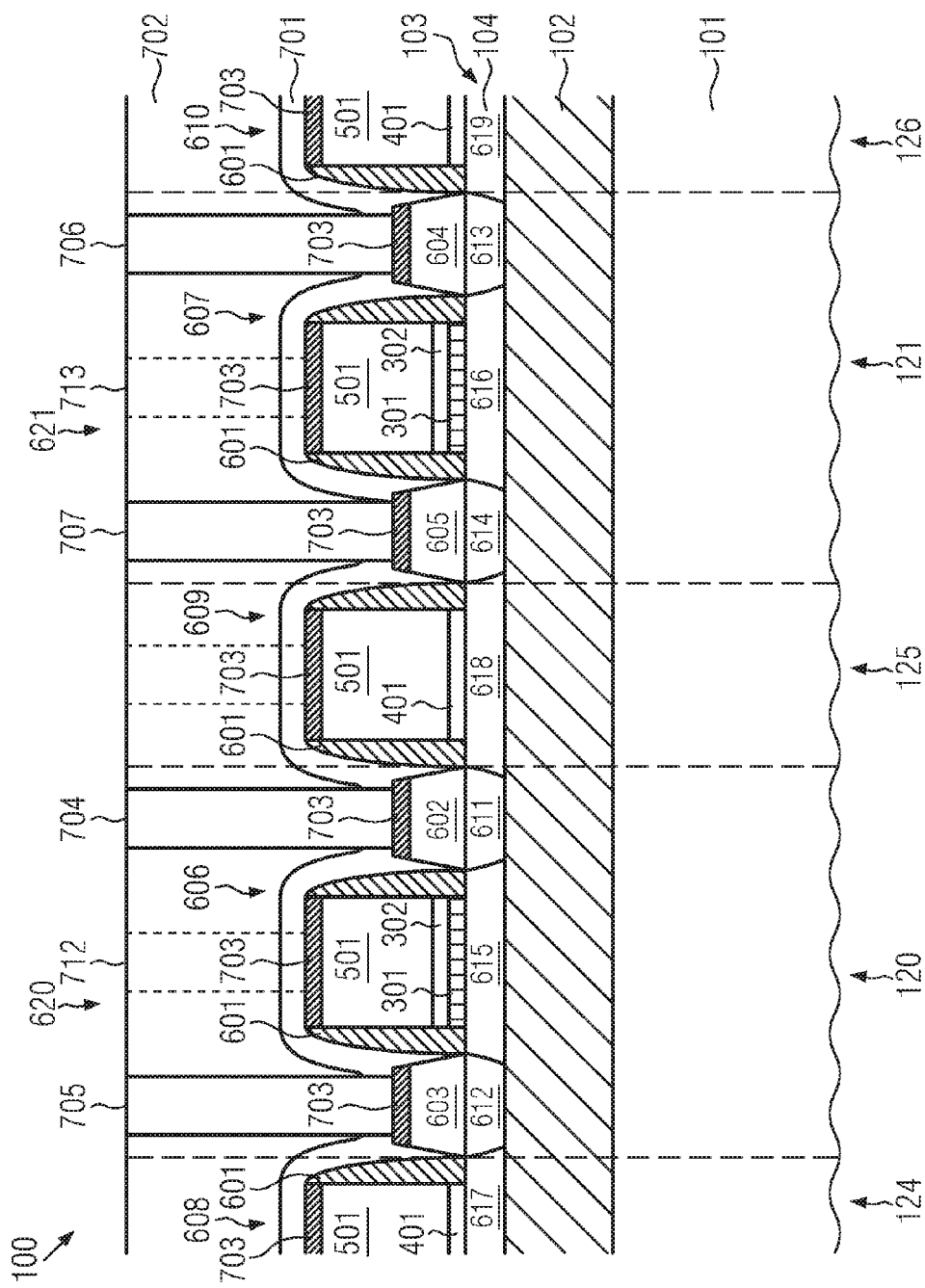

FIGS. 7a and 7b show schematic views of the semiconductor structure 100 at a later stage of the method. FIG. 7a shows a schematic top view corresponding to the view of FIG. 6a, and FIG. 7b shows a schematic cross-sectional view along the line 106 corresponding to the view of FIG. 6b.

A silicide 703 may be formed in each of the raised source regions 602, 604, 624, 626, the raised drain regions 603, 605, 625, 627, the gate structures 606, 607 and the dummy gate structures 608, 609, 610. For this purpose, a layer of a metal such as, for example, nickel may be deposited over the semiconductor structure 100, and one or more annealing processes may be performed for chemically reacting the metal with the semiconductor material of the raised source regions 602, 604, 624, 626, the raised drain regions 603, 605, 625, 627 and the portions of the polysilicon or amorphous silicon 501 in the gate structures 606, 607 and the dummy gate structures 608, 609, 610. Thereafter, unreacted metal may be removed by means of an etch process.

Then, a liner layer 701, which may include silicon nitride, and an interlayer dielectric 702, which may include silicon dioxide, may be deposited over the semiconductor structure 100 by means of deposition techniques such as CVD and/or PECVD. A chemical mechanical polishing (CMP) process may be performed for obtaining a substantially planar surface of the interlayer dielectric 702.

Thereafter, source contacts 704, 706, 708, 710 extending through the interlayer dielectric 702 and the liner layer 701 and providing electrical connections to the raised source regions 602, 604, 624, 626 and drain contacts 705, 707, 709, 711 extending through the interlayer dielectric 702 and the liner layer 701 and providing electrical connections to the raised drain regions 603, 605, 625, 627 may be formed. Additionally, gate contacts 712, 713 extending through the interlayer dielectric 702 and the liner layer 701 and providing electrical connections to the gate structures 606, 607 may be formed. For forming the source contacts 704, 706, 708, 710, the drain contacts 705, 707, 709, 711 and the gate contacts 712, 713, contact holes extending through the interlayer dielectric 702 and the liner layer 701 may be formed, and the contact holes may be filled with an electrically conductive material such as, for example, tungsten. This may be done using known techniques for the formation of contacts to circuit elements in semiconductor structures.

As can be seen in the top view of FIG. 7a, no contacts to the dummy gate electrodes provided by the portions of the polysilicon or amorphous silicon layer 501 in the dummy gate structures 608, 609, 610 need to be formed. Thus, the dummy gate electrodes may be electrically floating.

Further steps for forming an integrated circuit on the basis of the semiconductor structure 100 may include known back-end-of-line manufacturing steps.

Figure 8A:
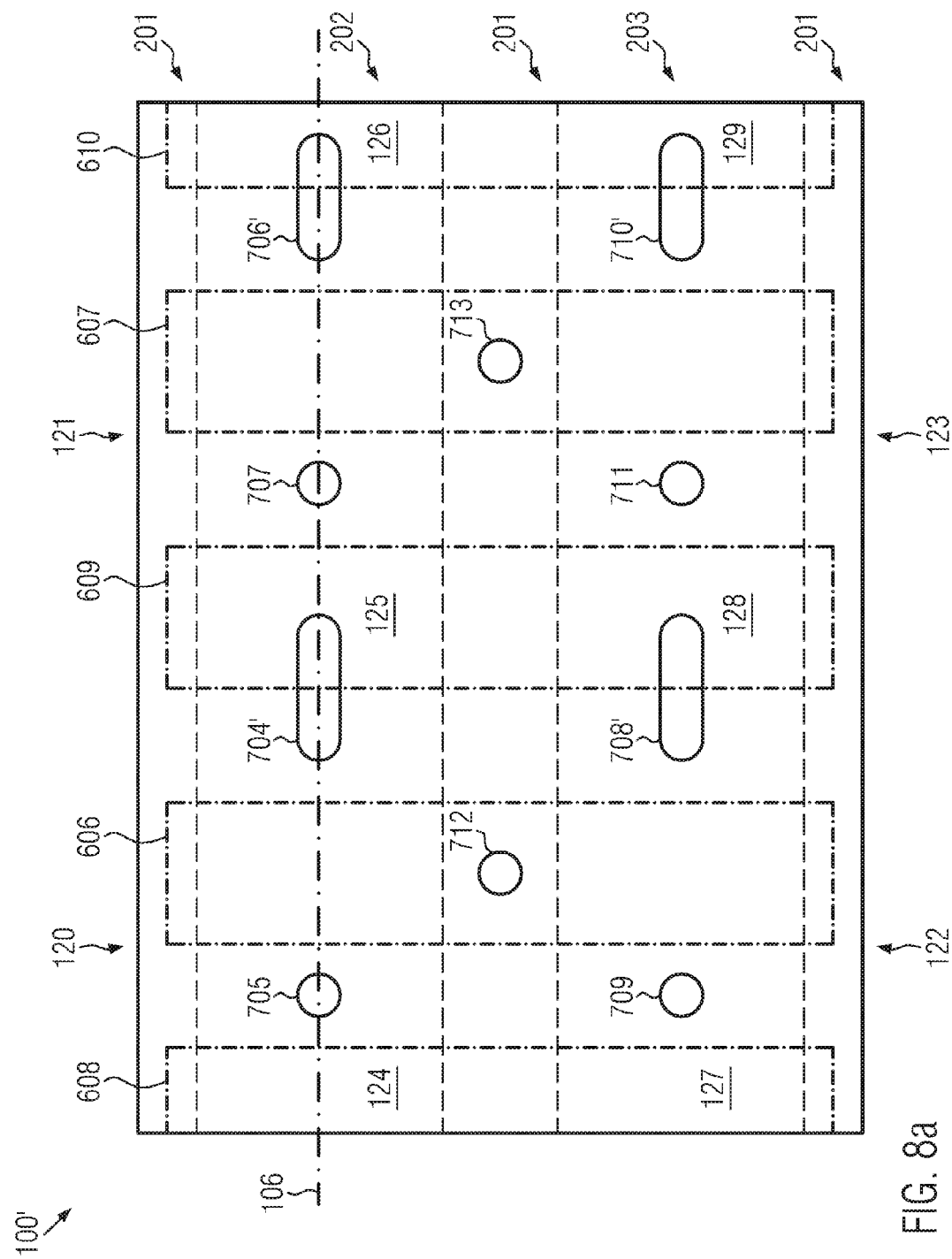
FIGS. 8a-8b show schematic views of a semiconductor structure in a stage of a method according to an embodiment.
Figure 8B:
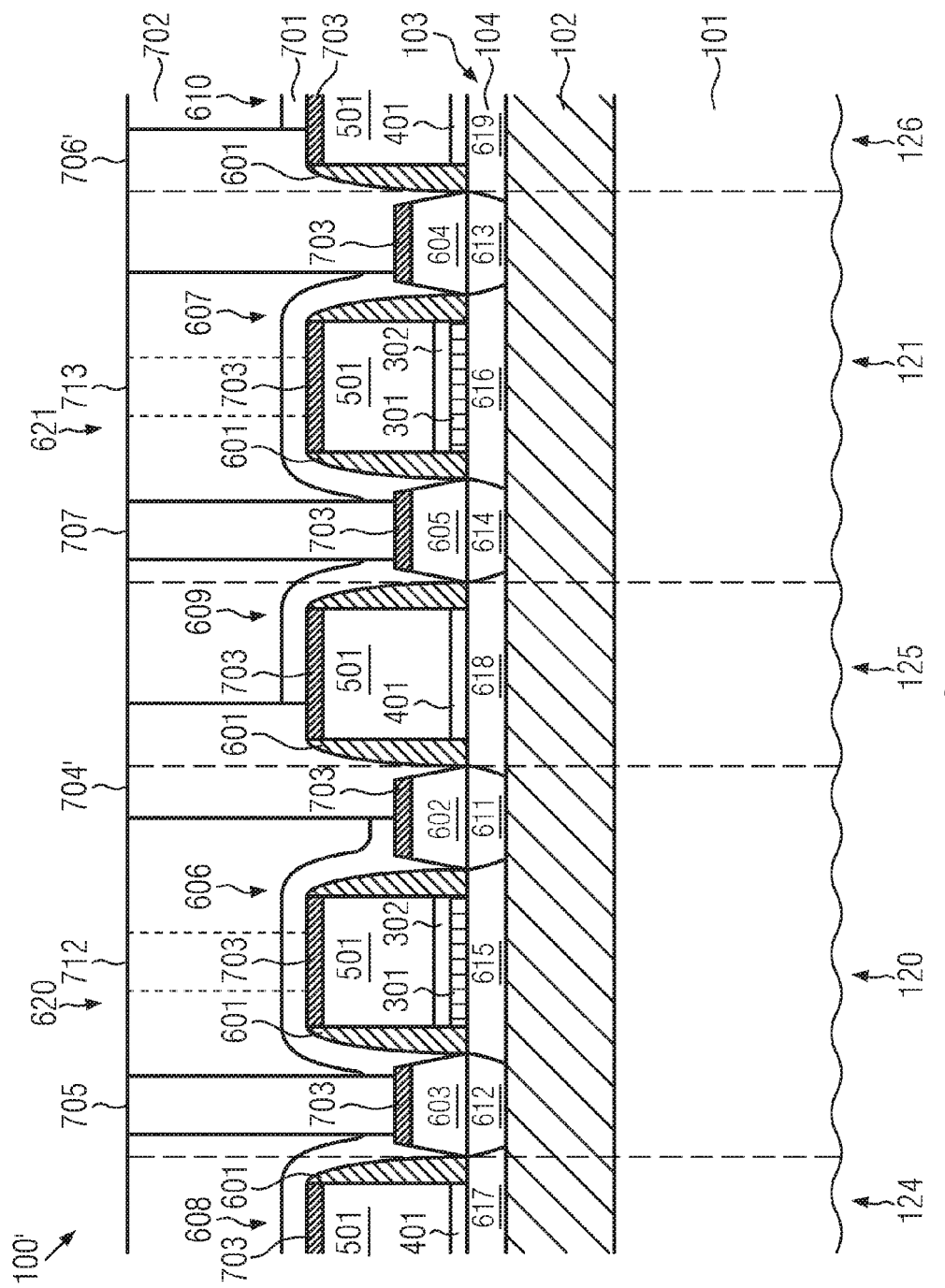

The present disclosure is not limited to embodiments wherein the dummy gate electrodes in the dummy gate structures 608, 609, 610 are electrically floating, as described above with reference to FIGS. 7a and 7b. FIGS. 8a and 8b show schematic views of a semiconductor structure 100', being a variant of the semiconductor structure 100 described above with reference to FIGS. 1a to 7b, wherein the dummy gate structures 608, 609, 610 are electrically connected to source regions of adjacent transistors. Other features of the semiconductor structure 100' may correspond to those of the semiconductor structure 100 described above with reference to FIGS. 1a to 7b, and a detailed description thereof will be omitted for convenience.

FIG. 8a shows a schematic top view of the semiconductor structure 100' at a stage of the manufacturing process corresponding to that shown in FIGS. 7a and 7b, and FIG. 8b shows a schematic cross-sectional view of the semiconductor structure 100' along the line 106. Components shown in FIGS. 8a and 8b may have features corresponding to those of components denoted by like reference numerals in FIGS. 7a and 7b, and corresponding methods may be used for the formation thereof.

The semiconductor structure 100' may include a source and gate contact 704' extending through the interlayer dielectric 702 and the liner layer 701 and providing an electrical connection to the raised source region 602 of the transistor 620 and a portion of the polysilicon or amorphous silicon layer 501 providing a dummy gate in the electrode gate structure 609 over the dummy channel region 618. Additionally, a source and gate contact 706' may be provided which extends through the interlayer dielectric 702 and the liner layer 701 and provides an electrical connection to the raised source region 604 and the portion of the polysilicon or amorphous silicon layer 501 that provides a dummy gate electrode in the dummy gate structure 610 over the dummy channel region 619. Moreover, a source and gate contact providing an electrical connection to the portion of the polysilicon or amorphous silicon layer 501 in the dummy gate structure 608 and a raised source region on a side of the dummy gate structure 608 opposite the raised drain region 603 may be provided. Thus, the dummy gate electrodes in the dummy gate structures 608, 609, 610 may be electrically connected to source regions in the continuous active region 202 adjacent thereto so that, in the respective dummy transistors, a gate voltage of approximately 0 V is applied, and the dummy transistors are in their electrically substantially non-conductive OFF-state.

Furthermore, the semiconductor structure 100' may include a source and gate contact 708' providing an electrical connection between the portion of the dummy gate electrode in the gate structure 609 over the continuous active region 203 and the raised source region 624 and a source and gate contact 710' providing an electrical connection between the dummy gate electrode in the portion of the dummy gate structure 610 over the continuous active region 203 and the raised source region 626. Furthermore, the portion of the dummy gate electrode in the dummy gate structure 608 over the continuous active region 203 may be electrically connected to a raised source region (not shown) on a side of the dummy gate structure 608 opposite the raised drain region 625. Thus, gate voltages of approximately 0 V may be applied to the portions of the dummy gate structures 608, 609, 610 over the continuous active region 203, and the dummy transistors at the continuous active region 203 may be maintained in their electrically substantially non-conductive OFF-state.

An electrical insulation between the portions of the dummy gate structures 608, 609, 610 over the continuous active region 202, on the one hand, and the continuous active region 203, on the other hand, may be provided by a PN transition between the differently doped portions of the gate structures 608, 609, 610.

In other embodiments, which will be described in the following with reference to FIG. 9, dummy gate structures that do not include a high-k material and a workfunction adjustment metal may be used for providing an electrical insulation between N-channel transistors and P-channel transistors that are arranged adjacent each other. For convenience, in FIGS. 1a to 8b, on the one hand, and in FIG. 9, on the other hand, like reference numerals have been used to denote like components. Unless explicitly indicated otherwise, components denoted by like reference numerals may have corresponding features, and corresponding methods may be used for the formation thereof. Therefore, a detailed description thereof will sometimes be omitted.

Figure 9:
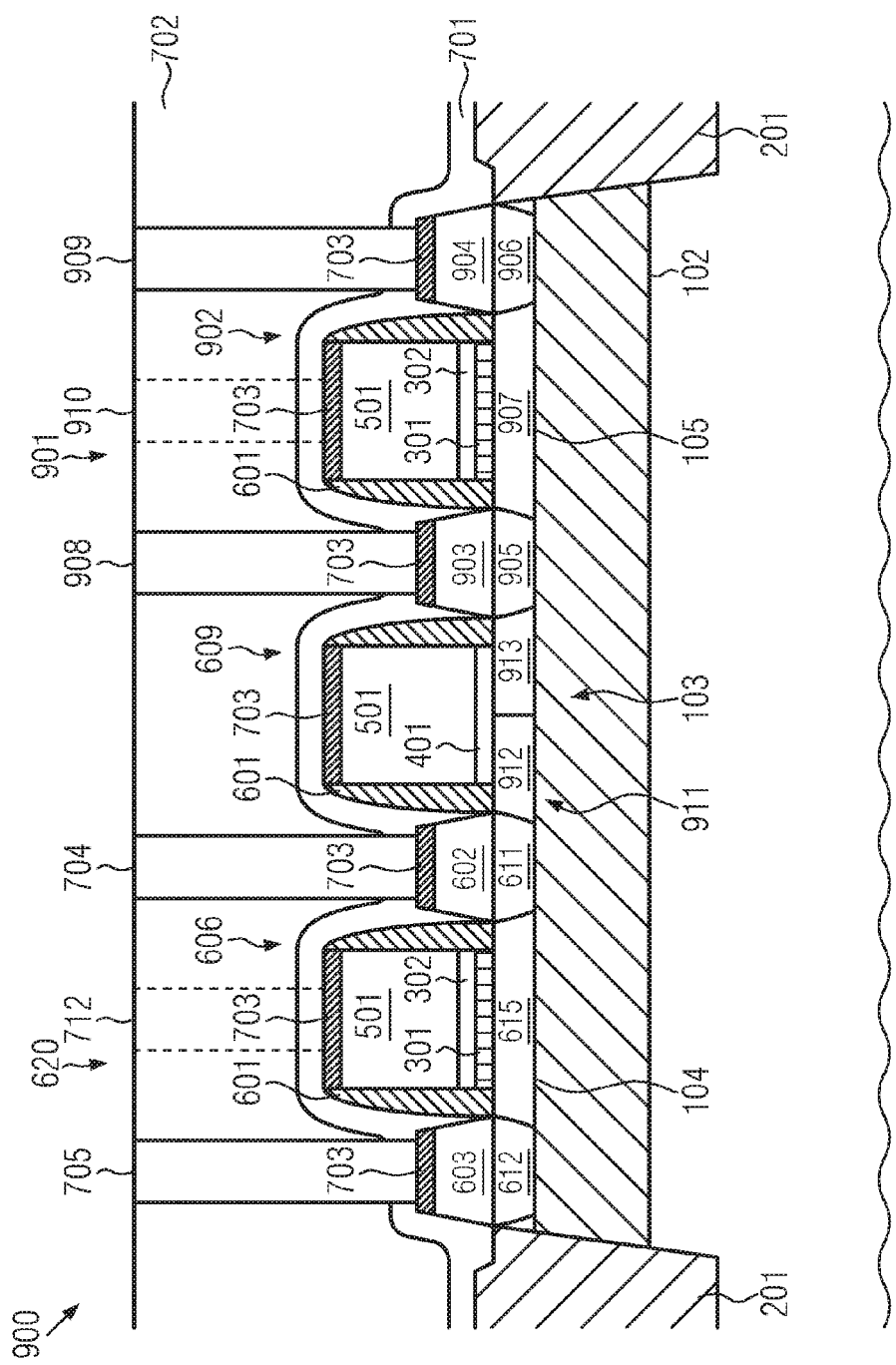
FIG. 9 shows a schematic view of a semiconductor structure in a stage of a method according to an embodiment.

FIG. 9 shows a schematic cross-sectional view of a semiconductor structure 900 in a stage of a method according to an embodiment corresponding to the stage of the method illustrated in FIGS. 7a to 8b.

The semiconductor structure 900 may include a support substrate 101, an electrically insulating layer 102 and a semiconductor layer 103, which provide a semiconductor-on-insulator (SOI) structure. The semiconductor layer 103 may include a silicon portion 104 and a silicon germanium portion 105, which provide a continuous active region.

The semiconductor structure 900 may further include a transistor 620, which may be an N-channel field effect transistor having a source region 611, a drain region 612 and a channel region 615 that are provided in the silicon portion 104 of the semiconductor layer 103, and a transistor 901, which may be a P-channel field effect transistor, having a source region 905, a drain region 906 and a channel region 907 in the silicon germanium portion 105 of the semiconductor layer 103. Between the source region 611 of the transistor 620 and the source region 905 of the transistor 901, a dummy channel region 911 may be provided. The dummy channel region 911 may include a portion 912 that is provided in the silicon portion 104 of the semiconductor layer 103 and a portion 913 that is provided in the silicon germanium portion 905 of the semiconductor layer 103. The portion 912 of the dummy channel region 911 may have a doping corresponding to the doping of the channel region 615 of the N-channel transistor 620, and the portion 913 of the dummy channel region 911 may have a doping corresponding to the doping of the channel region 907 of the P-channel transistor 901. In some embodiments, the portion 912 of the dummy channel region 911 may be P-doped, and the portion 913 of the dummy channel region 911 may be N-doped.

The transistor 620 may include a raised source region 603 over the source region 612, a raised drain region 602 over the drain region 611 and a gate structure 606. The transistor 901 may include a raised source region 903, a raised drain region 904 and a gate structure 902.

The raised source region 602 and the raised drain region 603 of the transistor 620 may be N-doped, and the raised source region 903 and the raised drain region 904 of the transistor 901 may be P-doped. In each of the gate structures 606, 902 of the transistors 620, 901, a gate insulation layer provided by a portion of a layer 301 of a high-k material and a portion of a layer 302 of a workfunction adjustment metal may be provided. In some embodiments, different workfunction adjustment metals may be provided in the gate structure 606 of the N-channel transistor 620 and the gate structure 902 of the P-channel transistor 901.

Additionally, each of the gate structures 606, 902 may include a portion of a polysilicon or amorphous silicon layer 501. The portion of the polysilicon or amorphous silicon layer 501 and the portion of the layer 302 of the workfunction adjustment metal in the gate structure 606 provide a gate electrode of the transistor 620, and the portions of the polysilicon or amorphous silicon layer 501 and the layer 302 of the workfunction adjustment metal in the gate structure 902 provide a gate electrode of the transistor 901.

Over the dummy channel region 911, a dummy gate structure 609 may be provided. The dummy gate structure 609 may include a dummy gate insulation layer provided by a portion of a layer 401 of an electrically insulating material having a smaller dielectric constant than the high-k material of the layer 301 of high-k material and a dummy gate electrode provided by a portion of the polysilicon or amorphous silicon layer 501. The portion of the polysilicon or amorphous silicon layer 501 in the dummy gate structure 609 may be highly doped, for example, it may have a concentration of a P-type dopant in a range from about $10^{18}$ atoms/cm$^3$ to about $10^{22}$ atoms/cm$^3$. Adjacent each of the gate structures 606, 902 and the dummy gate structure 609, a sidewall spacer 601 may be provided, and a silicide 703 may be provided in each of the raised source regions 602, 903, the raised drain regions 603, 904 and the portions of the polysilicon or amorphous silicon layer 501 in the gate structures 606, 902 and the dummy gate structure 609.

The semiconductor structure 900 may further include a trench isolation structure 201, a liner layer 701 and an interlayer dielectric 702. Source contacts 704, 908, drain contacts 705, 909 and gate contacts 712, 910 may be provided for providing electrical connections to the raised source regions 602, 903, the raised drain regions 603, 904 and the gate electrodes of the transistors 620, 901. The dummy gate electrode provided by the portion of the polysilicon or amorphous silicon layer 501 in the dummy gate structure 609 may be electrically floating.

The doping of the portion of the polysilicon or amorphous silicon layer 501 in the dummy gate structure 609 may be adapted such that substantially no electrically conductive channel is formed in at least one of the portions 912, 913 of the dummy channel region 911. Thus, an electrical insulation may be provided between the transistors 620, 901.

The present disclosure is not limited to embodiments wherein the dummy channel region 911 includes a portion 912 provided in the silicon portion 104 of the semiconductor layer 103 and a portion 913 provided in the silicon germanium portion 105 of the semiconductor layer 103. In other embodiments, the entire dummy channel region 911 may be provided either in the silicon portion 104 or in the silicon germanium portion 105 of the semiconductor layer 103. For example, in some embodiments, the dummy channel region 911 may be provided in the silicon germanium portion 105 of the semiconductor layer 103, and an interface between the silicon portion 104 and the silicon germanium portion 105 may be provided at an interface between the source region 611 of the transistor 620 and the dummy channel region 911.

The present disclosure is not limited to embodiments wherein the dummy gate structures 608, 609, 610 are provided over dummy channel regions. In other embodiments, the dummy gate structures 608, 609, 610 may be provided over electrically insulating dummy gate regions provided in portions of the trench isolation structure 201 extending in the channel width direction of transistors formed in a semiconductor structure. In such embodiments, issues caused by a high-k footing may be substantially avoided or at least reduced since the dummy gate structures need not include a high-k material and/or a workfunction adjustment metal.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. An integrated circuit, comprising:
   a first transistor comprising a first gate structure, said first gate structure comprising a first gate insulation layer comprising a high-k dielectric material and a first gate electrode;
   a second transistor comprising a second gate structure, said second gate structure comprising a second gate insulation layer comprising said high-k dielectric material and a second gate electrode; and
   a dummy gate structure arranged between said first transistor and said second transistor, wherein said dummy gate structure substantially does not comprise said high-k dielectric material.

2. The integrated circuit of claim 1, further comprising a continuous active region;
   wherein said first transistor comprises a first source region, a first drain region and a first channel region provided in said continuous active region;
   wherein said second transistor comprises a second source region, a second drain region and a second channel region provided in said continuous active region; and
   wherein said dummy gate structure is provided over a dummy channel region, said dummy channel region being provided in said continuous active region, said dummy channel region being arranged between one of said first source region and said first drain region and one of said second source region and said second drain region.

3. The integrated circuit of claim 2, wherein each of said first gate electrode and said second gate electrode comprises a respective workfunction adjustment metal layer and said dummy gate structure does not comprise a workfunction adjustment metal layer.

4. The integrated circuit of claim 3, wherein said dummy gate structure comprises a dummy gate insulation layer comprising one or more electrically insulating materials having a smaller dielectric constant than said high-k dielectric material and a dummy gate electrode comprising at least one of doped polysilicon and doped amorphous silicon.

5. The integrated circuit of claim 4, further comprising:
   a semiconductor layer, said continuous active region being provided in said semiconductor layer;
   a support substrate; and
   an electrically insulating layer between said support substrate and said semiconductor layer, wherein said semiconductor layer, said electrically insulating layer and said support substrate provide a fully depleted semiconductor-on-insulator structure.

6. The integrated circuit of claim 5, wherein each of said first source region, said first drain region, said second source region and said second drain region has a same type of doping and said dummy channel region is doped differently than said one of said first source region and said first drain region and said one of said second source region and said second drain region between which said dummy channel region is arranged.

7. The integrated circuit of claim 6, wherein said dummy gate electrode is electrically floating, and said dummy gate electrode is doped such that substantially no electrically conductive channel is formed in said dummy channel region.

8. The integrated circuit of claim 6, wherein said dummy channel region is arranged between said first source region and said second drain region, and wherein said dummy gate electrode is electrically connected to said first source region.

9. The integrated circuit of claim 6, further comprising:
a first raised source region over said first source region;
a first raised drain region over said first drain region;
a second raised source region over said second source region;
a second raised drain region over said second drain region;
an interlayer dielectric over said first transistor, said second transistor and said dummy gate structure;
one or more of a first source contact extending through said interlayer dielectric and providing an electrical connection to said first raised source region, a first drain contact extending through said interlayer dielectric and providing an electrical connection to said first raised drain region and a first gate contact extending through said interlayer dielectric and providing an electrical connection to said first gate electrode; and
one or more of a second source contact extending through said interlayer dielectric and providing an electrical connection to said second raised source region, a second drain contact extending through said interlayer dielectric and providing an electrical connection to said second raised drain region and a second gate contact extending through said interlayer dielectric and providing an electrical connection to said second gate electrode.

10. The integrated circuit of claim 5, wherein:
said first transistor is an N-channel transistor, said first source region and said first drain region being N-doped;
said second transistor is a P-channel transistor, said second source region and said second drain region being P-doped;
said first source region, said first channel region and said first drain region are formed in a silicon portion of said continuous active region;
said second source region, said second channel region and said second drain region are formed in a silicon germanium portion of said continuous active region; and
at least a part of said dummy channel region is provided in said silicon germanium portion of said continuous active region.

* * * * *